US008836074B2

(12) United States Patent
You et al.

(10) Patent No.: US 8,836,074 B2
(45) Date of Patent: Sep. 16, 2014

(54) SEMICONDUCTOR MEMORY DEVICE

(71) Applicant: Samsung Electronics Co., Ltd., Suwon-si (KR)

(72) Inventors: Byung-Kwan You, Seoul (KR); Seung-Woo Paek, Yongin-si (KR); Chung-Il Hyun, Seoul (KR); Jung-Dal Choi, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/728,785

(22) Filed: Dec. 27, 2012

(65) Prior Publication Data
US 2013/0175663 A1 Jul. 11, 2013

(30) Foreign Application Priority Data
Jan. 5, 2012 (KR) ........................ 10-2012-0001647

(51) Int. Cl.
*H01L 29/06* (2006.01)
*H01L 21/28* (2006.01)
*H01L 27/10* (2006.01)
H01L 27/115 (2006.01)
H01L 29/66 (2006.01)

(52) U.S. Cl.
CPC ........... *H01L 27/10* (2013.01); *H01L 27/11524* (2013.01); *H01L 29/66636* (2013.01); *H01L 27/11519* (2013.01); *H01L 27/11521* (2013.01); *H01L 27/115* (2013.01)
USPC ........... 257/503; 257/505; 257/506; 257/507; 257/508; 257/E21.69; 257/E21.158; 257/E29.018; 438/257; 438/386; 438/593

(58) Field of Classification Search
CPC . H01L 27/10; H01L 27/11521; H01L 27/115; H01L 27/11519; H01L 27/11524; H01L 29/66636
USPC ............ 257/503, 505, 506, 507, 508, E21.69, 257/E21.158, E29.018; 438/257, 386, 593
See application file for complete search history.

(56) References Cited

U.S. PATENT DOCUMENTS

| | | | |
|---|---|---|---|
| 6,689,658 B2 | 2/2004 | Wu | |
| 7,939,423 B2 | 5/2011 | Wu | |
| 2008/0079112 A1* | 4/2008 | Uchiyama | 257/506 |
| 2008/0081404 A1 | 4/2008 | Barna et al. | |
| 2009/0302472 A1 | 12/2009 | Yoon et al. | |
| 2010/0001366 A1* | 1/2010 | Jang et al. | 257/503 |
| 2011/0201189 A1* | 8/2011 | Byun et al. | 438/593 |

FOREIGN PATENT DOCUMENTS

| | | |
|---|---|---|
| KR | 1020030088628 | 11/2003 |
| KR | 1020090127007 | 12/2009 |

* cited by examiner

*Primary Examiner* — Dao H Nguyen
(74) *Attorney, Agent, or Firm* — F. Chau & Associates, LLC

(57) ABSTRACT

A semiconductor memory device includes linear patterns disposed between isolation trenches extending in a first direction in a semiconductor device and having a first crystal direction the same as the semiconductor substrate. A bridge pattern connects at least two adjacent linear patterns and includes a semiconductor material having a second crystal direction different from the first crystal direction. A first isolation layer pattern is disposed in at least one of the isolation trenches in a field region of the semiconductor substrate. Memory cells are disposed on at least one of the linear patterns.

5 Claims, 26 Drawing Sheets

SEMICONDUCTOR MEMORY DEVICE

CROSS-REFERENCE TO RELATED APPLICATION

This application claims priority under 35 U.S.C. §119 to Korean Patent Application No. 10-2012-0001647, filed on Jan. 5, 2012, the entire disclosure of which is hereby incorporated by reference herein in its entirety.

BACKGROUND

1. Technical Field

Example embodiments relate to a semiconductor memory device and a method of manufacturing the semiconductor memory device. More particularly, example embodiments relate to a semiconductor memory device including an active pattern and a method of manufacturing the semiconductor memory device.

2. Discussion of the Related Art

Patterns for memory cells may be formed on an active pattern to manufacture a semiconductor memory device. To provide high integration and large data capacity for the semiconductor memory device, various active patterns of the semiconductor memory device and methods of forming the active patterns are being researched and developed.

SUMMARY

Example embodiments provide semiconductor memory devices including an active pattern of a fine line width.

Example embodiments provide methods of manufacturing the semiconductor memory device.

According to an example embodiment, a semiconductor memory device includes linear patterns provided between isolation trenches extending in a first direction in a semiconductor device and having a first crystal direction the same as the semiconductor substrate. A bridge pattern connects at least two adjacent linear patterns and includes a semiconductor material having a second crystal direction different from the first crystal direction. A first isolation layer pattern is disposed in at least one of the isolation trenches in a field region of the semiconductor substrate. Memory cells are disposed on at least one of the linear patterns.

In example embodiments, the semiconductor memory device may further include a second isolation layer pattern disposed under the bridge pattern in at least one of the isolation trenches to support the bridge pattern, and wherein the second isolation layer pattern has an upper surface lower than an upper surface of the first isolation layer pattern.

In example embodiments, the bridge pattern may fill up the at least one of the isolation trenches in an active region of the semiconductor substrate.

In example embodiments, the semiconductor memory device may further include an insulation interlayer covering the semiconductor substrate and a contact plug penetrating the insulation interlayer to make contact with the bridge pattern.

In example embodiments, the bride pattern and the contact plug may be arranged in a zigzag along a second direction perpendicular to the first direction.

In example embodiments, the linear pattern and the bridge pattern may be positioned in an active region.

According to an example embodiment, in a method of manufacturing a semiconductor memory device, a semiconductor substrate is etched to form an isolation trenches extending in a first direction and linear patterns disposed between the isolation trenches having a first crystal direction. A preliminary isolation layer pattern is formed in at least one of the isolation trenches. The preliminary isolation layer pattern is etched to form an isolation layer pattern including an opening that exposes at least upper sidewall of at least one of the linear patterns. A selective epitaxial growth process is performed on the exposed sidewall of the at least one of the linear patterns to form a bridge pattern including a semiconductor material having a second crystal direction different from the first crystal direction. Memory cells are formed on the at least one of the linear patterns.

In example embodiments, forming the preliminary isolation layer pattern may include forming a first isolation layer pattern in a field region of the semiconductor substrate and a second isolation layer pattern under the bridge pattern while the preliminary isolation layer pattern remains on a bottom surface of the opening.

In example embodiments, the method may further comprising forming the bridge pattern on the second isolation layer pattern.

In example embodiments, forming the preliminary isolation layer pattern may include exposing the semiconductor substrate through a sidewall and a bottom surface of the opening.

In example embodiments, the bridge pattern may be formed to make contact with the bottom surface of the opening and the exposed upper sidewall of the at least one of the linear patterns.

In example embodiments, the method may further include forming a pad insulation layer pattern and a hard mask pattern that cover an upper surface of the linear patterns and serve as an etching mask for forming the isolation trench.

In example embodiments, the method may further include removing the hard mask pattern while the pad insulation layer pattern remains, after forming the isolation layer pattern.

In example embodiments, the method may further include removing the hard mask pattern while the pad insulation layer pattern remains, after forming the preliminary isolation layer pattern.

In example embodiments, the method may further include forming an insulation interlayer to cover the semiconductor substrate, forming a contact hole that penetrates the insulation interlayer to expose the bridge pattern, and forming a contact plug in the contact hole to make contact with the bridge pattern.

According to example embodiments, an active pattern may include at least two linear patterns and a bridge pattern that connects two or more linear patterns to each other. The bridge pattern may be formed by a crystal growth process to include a silicon crystal direction different from a substrate. The bridge pattern may be formed to have desired size and thickness.

Further, as the bridge pattern is formed without performing a photolithography process, a process margin may be increased to readily four the bridge pattern.

BRIEF DESCRIPTION OF THE DRAWINGS

Example embodiments can be more clearly understood from the following detailed description taken in conjunction with the accompanying drawings. FIGS. 1 to 15 represent non-limiting, example embodiments as described herein.

FIG. 1 is a block diagram illustrating a NAND flash memory device in accordance with an example embodiment.

FIG. 2 is a circuit diagram illustrating a cell array of a NAND flash memory device in accordance with an example embodiment.

FIG. 8 is a cross-sectional view illustrating a NAND flash memory device in accordance with an example embodiment.

FIG. 15 is a block diagram illustrating a system in accordance with an example embodiment.

DETAILED DESCRIPTION OF EXAMPLE EMBODIMENTS

Figure 1:
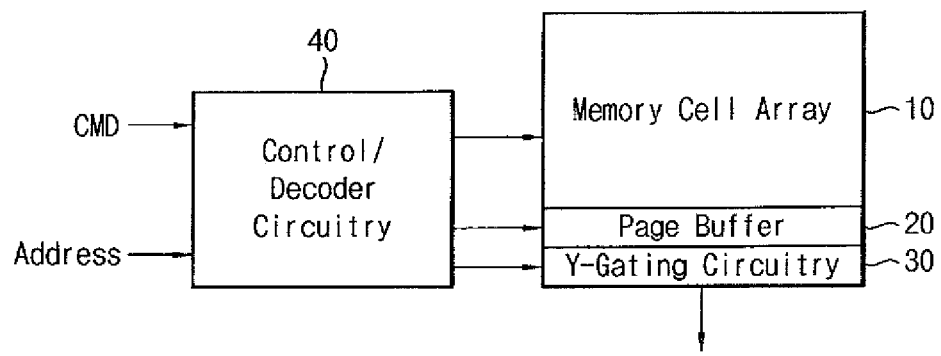

Various example embodiments will be described more fully hereinafter with reference to the accompanying drawings, in which example embodiments are shown. Example embodiments may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, example embodiments will be explained in detail with reference to the accompanying drawings.

An active pattern according to example embodiments may include, for example, a binding portion that connects two or more linear patterns to each other. The active pattern may be applied to an active region of various semiconductor devices. For example, the active pattern may be applied to cells of a NAND flash memory device having a structure of sharing two bit lines. Hereinafter, active patterns of a NAND flash memory and methods of forming the active pattern in accordance with example embodiments will be explained.

Figure 2:
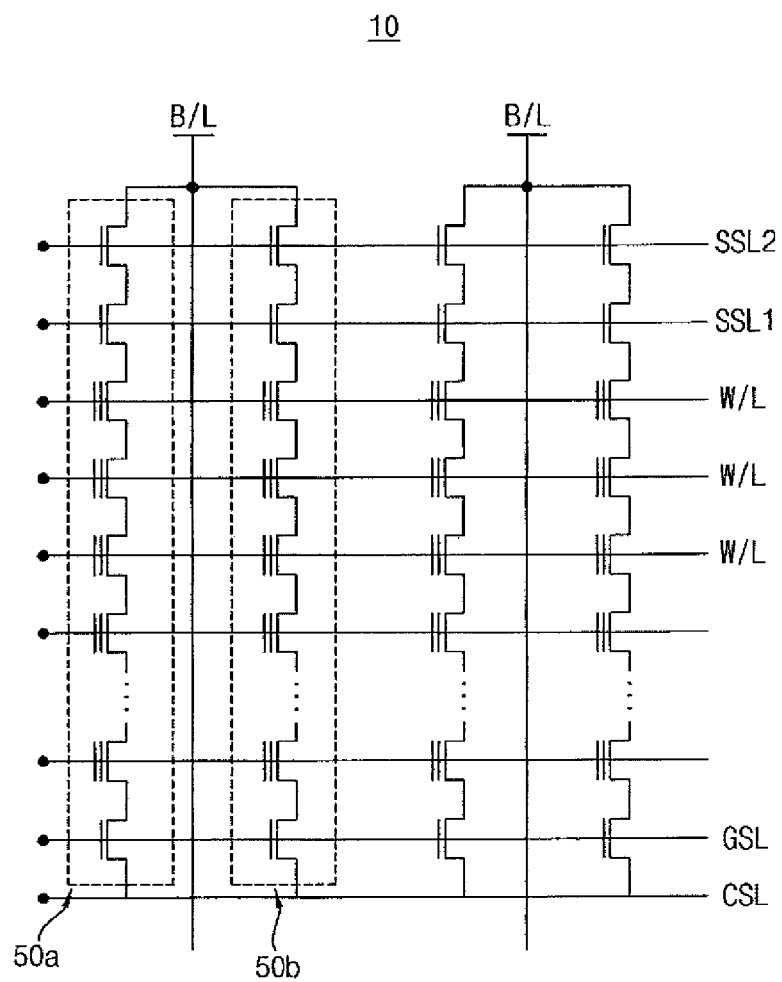

FIG. 1 is a block diagram illustrating a NAND flash memory device in accordance with an example embodiment. FIG. 2 is a circuit diagram illustrating a cell array of a NAND flash memory device in accordance with an example embodiment.

Referring to FIG. 1, a NAND flash memory device may include, for example, a memory cell array 10, a page buffer 20, a Y-gating circuitry 30 and a control/decoder circuitry 40. The memory cell array 10 may include, for example, a plurality of memory blocks. Each of the memory blocks may include, for example, a plurality of memory cells. The page buffer 20 may temporarily store data for the memory cell array 10 or from the memory cell array 10. The Y-gating circuitry 30 may transmit data that is stored in the page buffer 20. The control/decoder circuitry 40 may receive command (CMD) and address from outside, output a control signal for writing data in the memory cell array 10 or reading data from the memory cell array 10 and decode address. The control/decoder circuitry 40 may output a control signal for inputting/outputting data to/from the page buffer 20, and provide address information to the Y-gating circuitry 30.

Referring to FIG. 2, the memory cell array may include, for example, a first cell string 50a, a second cell string 50b adjacent to the first cell string 50b, a common bit line (B/L) commonly connected to end portions of the first and second cell strings 50a, 50b and a common source line (CSL) connected to other portions of the first and second cell strings 50a, 50b.

The memory cell array may include, for example, a plurality of unit cell strings. The unit cell string may include, for example, one common bit line (B/L) and two cell strings connected to the common bit line (B/L). Alternatively, the unit cell string may include, for example, one common bit line (B/L) and more than two cell strings connected to the common bit line (B/L).

Transistors included in each the string may include, for example, gates that are connected by a string selection line (SSL1, SSL2), word lines (WL), and a ground selection line (GSL).

For example, two transistors having different threshold voltages may be connected to one string to select one of two cell strings 50a, 50b connected to the common bit line (B/L). The selection transistors that share a gate line in two cell strings 50a, 50b sharing the bit line (B/L) may have, for example, different threshold voltages.

Accordingly, two or more strings may share one common bit line (B/L), to thereby increase integration of the device.

The cell array as illustrated in FIG. 2 may be embodied in many different forms on a semiconductor substrate. An active region of the semiconductor may be provided such that, for example, two strings are connected to one common bit line (B/L). Further, a common bit line contact may be provided to connect the active region and the common bit line (B/L).

Figure 3A:
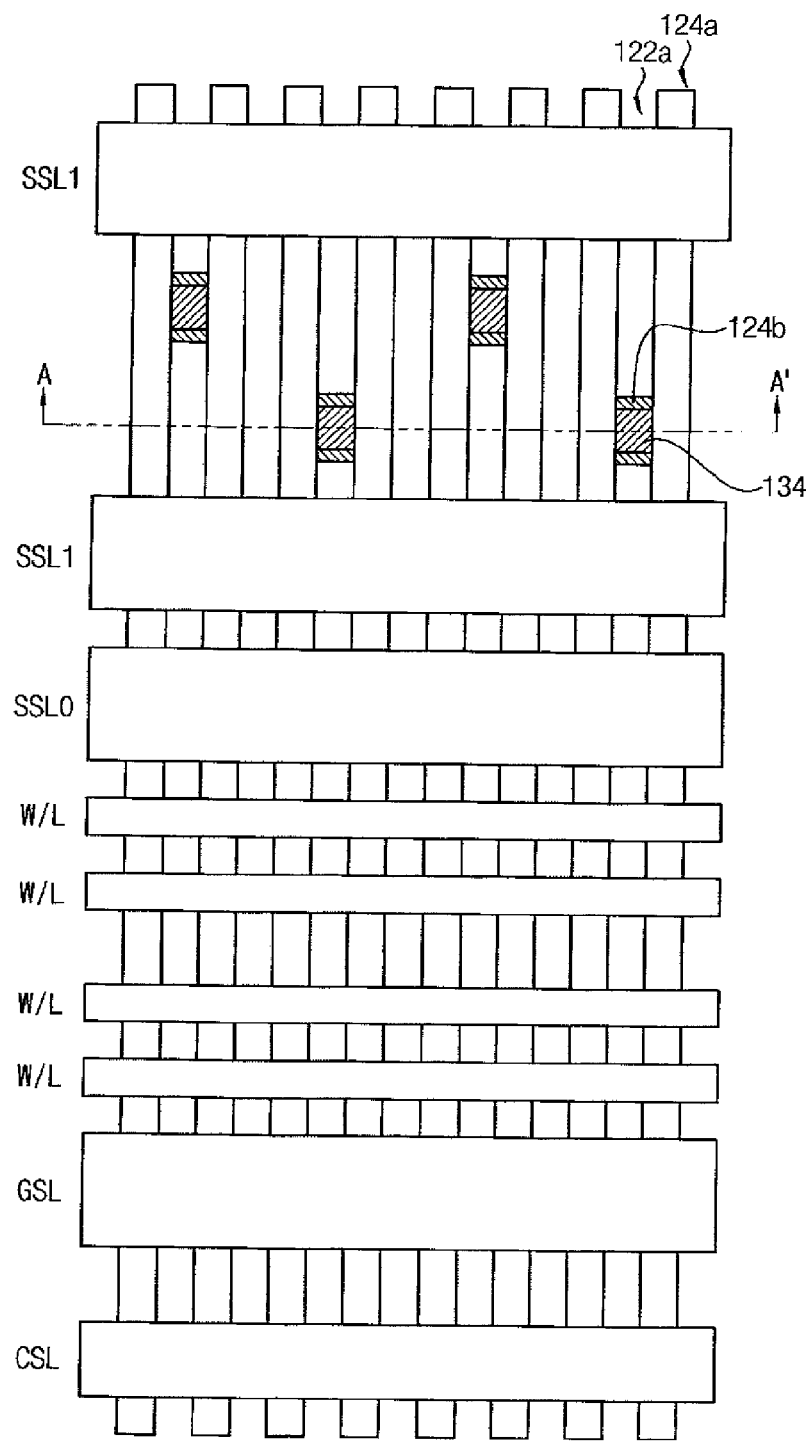
FIG. 3A is a plan view illustrating a cell array of a NAND flash memory device in accordance with an example embodiment.
Figure 3B:
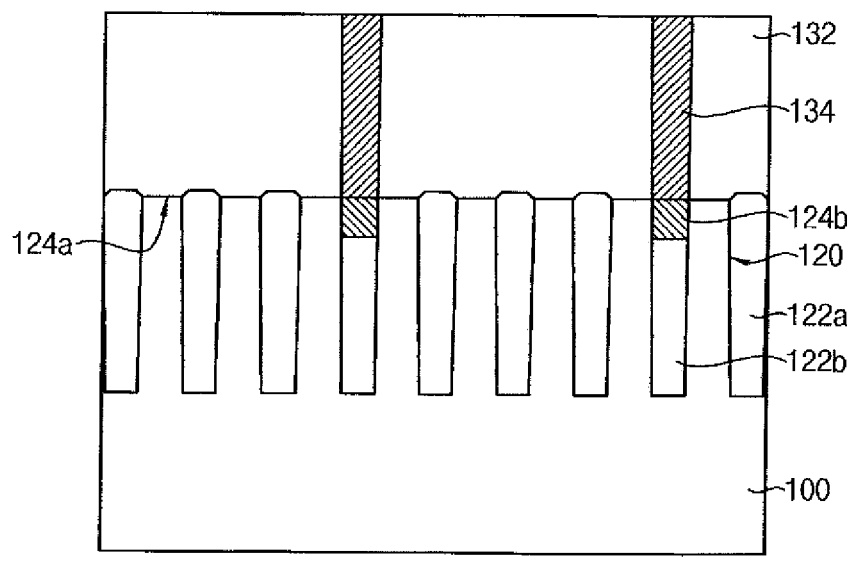
FIG. 3B is a cross-sectional view taken along the A-A' line in FIG. 3A.

FIG. 3A is a plan view illustrating a cell array of a NAND flash memory device in accordance with an example embodiment. FIG. 3B is a cross-sectional view taken along the A-A' line in FIG. 3A.

Referring to FIGS. 3A and 3B, a semiconductor substrate 100 may include, for example, an active region and a field region. For example, the semiconductor substrate 100 may include single-crystalline silicon, silicon germanium, etc. The active region of the semiconductor substrate 100 may include, for example, linear patterns 124a extending in a first direction and bridge patterns 124b extending in a second direction perpendicular to the first direction to connect the linear patterns 124a to each other. The linear patterns 124a may be, for example, arranged in parallel to one another.

An isolation trench 120 may be provided between the linear patterns 124a. The isolation trenches 120 may have, for example, a linear shape extending in the first direction. The isolation trenches 120 may be spaced apart from one another.

An isolation layer pattern 122a, 122b may be provided in the isolation trench 120. A first isolation layer pattern 122a may be provided in the isolation trench 120 at the field region. A second isolation layer pattern 122b may be provided in the isolation trench 120 at a position of the bridge pattern 124b. An upper surface of the second isolation layer pattern 122b may be, for example, lower than that of the first isolation layer pattern 122a. The second isolation layer pattern 122b may be formed to, for example, partially fill the isolation trench 120.

The bridge patterns 124b may be provided on the second isolation layer pattern 122b. The bridge pattern 124b may, for example, make contact with an upper sidewall of the linear pattern 124a to be connected to the linear pattern 124a. The bridge pattern 124b may be formed from the sidewall of the linear pattern 124a by, for example, an epitaxial growth. Accordingly, the bridge pattern 124b may have, for example, a crystal direction different from the linear pattern 124a that is formed by etching the semiconductor substrate 100. That is, the active region may include the bridge pattern 124b having a second crystal direction different from a first crystal direction of the linear pattern 124a.

Cell strings (not illustrated) may be provided in the linear pattern 124a.

The bridge pattern 124b may be provided, for example, in a position where the cell strings are connected to a common bit line (B/L). The bridge pattern 124b may serve as a pad region on which a common bit line contact 124 is formed.

In this embodiment, the bridge pattern 124b having one isolated shape may, for example, connect two linear patterns 124a to each other. If the bridge patterns 124b are arranged in a line, a margin between adjacent bridge patterns 124b may be decreased. Therefore, the bridge patterns 124b may be arranged in, for example, a zigzag pattern.

For example, in the active region, a string transistor, cell transistors and ground selection transistor may be provided on the linear patterns 124a. Gates of the transistors may be, for example, respectively connected to string selection line (SSL, e.g. SSL0 and SSL1), world lines (W/L), and ground selection line (GSL) extending in the second direction.

The cell string may include, for example, the string selection transistor, the ground selection transistor and cell transistors between the string selection transistor and the ground selection transistor that are connected to one another in series.

The cell transistor may include, for example, a tunnel oxide layer, a charge storage layer, a blocking dielectric layer and a control gate electrode on the substrate. The charge storage layer may serve as a floating gate pattern or a charge trapping layer pattern.

The string selection transistor and the ground selection transistor may have, for example, a stack structure which is the same as the cell transistor. Alternatively, the string selection transistor and the ground selection transistor may have, for example, a stack structure of the charge storage layer and the control gate electrode on the charge storage layer of the cell transistor.

A common source line (CSL) may be provided, for example, to a source region of the ground selection line (GSL). The common source line (CSL) may be arranged, for example, in parallel with the ground selection line (GSL).

An insulation interlayer 132 may be provided to cover the selection transistor and the cell transistors. The common bit line contact 134 may, for example, penetrate the insulation interlayer 132 to make contact with the bridge pattern 124b.

Common bit lines (not illustrated) may be provided, for example, to across on the insulation interlayer 132 to be connected to the common bit line contact 134.

FIGS. 4A to 4K are cross-sectional views illustrating a method of manufacturing the NAND flash memory device in FIGS. 3A and 3B. FIGS. 5A to 5D are plan views illustrating a method of manufacturing the NAND flash memory device in FIG. 3A. FIGS. 4A to 4K are cross-sectional views taken along the A-A' in FIG. 3A.

For example, in this embodiment, QPT (Quadruple Pattern Technology) process including one photolithography process and two double patterning processes may be performed to from an isolation trench. However, alternatively, for example, a double patterning process or a general patterning process may be performed to form the isolation trench.

Figure 4A:
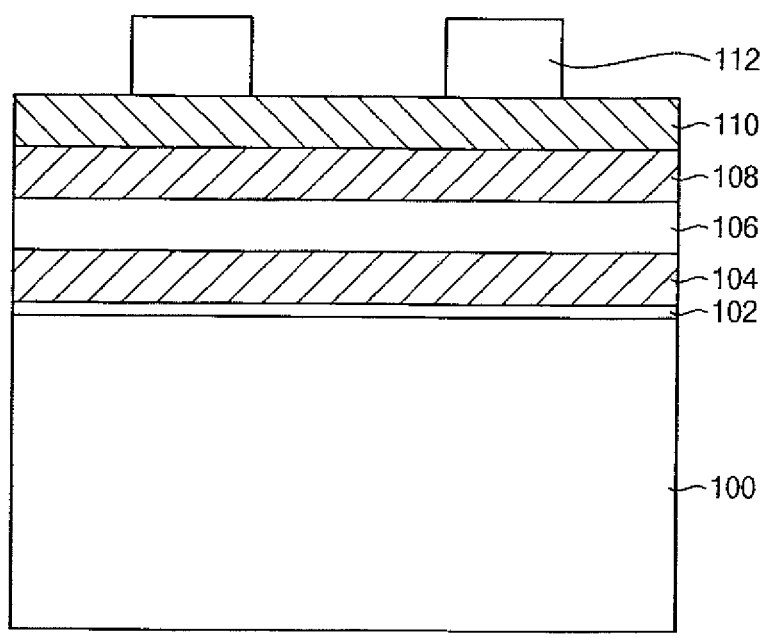
FIGS. 4A to 4K are cross-sectional views illustrating a method of manufacturing the NAND flash memory device in FIGS. 3A and 3B.

For example, referring to FIG. 4A, a pad insulation layer 102, a first hard mask layer 104, a first insulation layer 106 and a second hard mask layer 108 may be sequentially formed on a semiconductor substrate 100. In this embodiment, for example, an etch stop layer for forming a bridge pattern may not be formed on the second hard mask layer 108.

The first and second hard mask layers 104, 108 may be formed using, for example, polysilicon. The first insulation layer 106 may be formed using, for example, silicon oxide. The first insulation layer 106 may be formed by, for example, PE-CVD (pressure enhanced-chemical vapor deposition) process.

A first temporary mask layer 110 may be formed on the second hard mask layer 108. The first temporary mask layer 110 may be formed using, for example, amorphous carbon layer (ACL). An anti-reflective layer (not illustrated) may formed on the first temporary mask layer 110 using, for example, silicon oxynitride (SiON).

A second temporary mask layer (not illustrated) may be formed on the anti-reflective layer. The second temporary mask layer may be formed, for example, using polymer material. The second temporary mask layer may be readily removed by, for example, an ashing and strip process. For example, the second temporary mask layer may be formed using spin-on organic hard mask (SOH) or carbon-SOH (C-SOH).

For example, a photolithography process may be performed on the second temporary mask layer to form a photoresist pattern (not illustrated). The second temporary mask layer may be patterned using, for example, the photoresist pattern to form a second temporary mask pattern 112.

The second temporary mask pattern 112 may have, for example, a linear shape extending in a first direction. The second temporary mask pattern 112 may have, for example, a width about three times greater than a target width of a string to be formed. The second temporary mask patterns 112 may be spaced apart from each other by, for example, a distance about five times greater than the target width of a string to be formed.

Figure 4B:
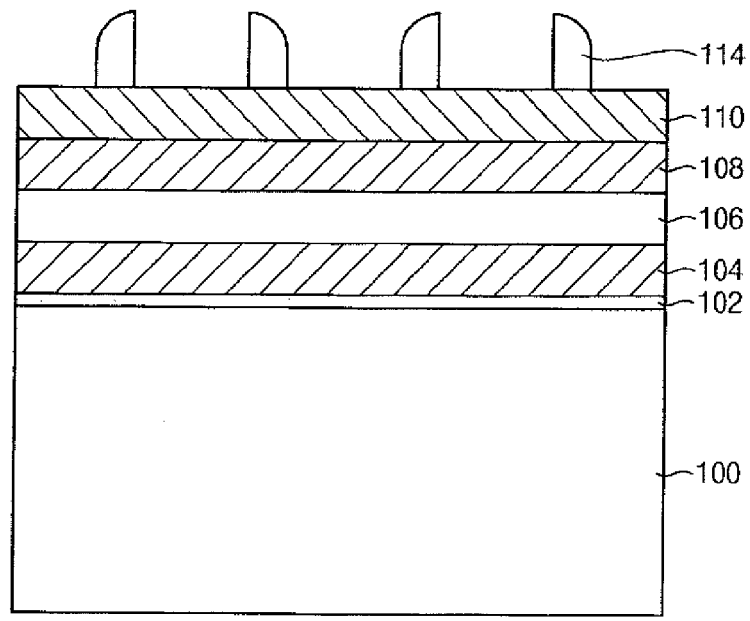

Referring to FIG. 4B, a first spacer layer (not illustrated) may be formed along on surfaces of the second temporary mask pattern 112 and the first temporary mask layer 110. The first spacer layer may be formed using, for example, silicon oxide. The first spacer layer may be formed by, for example, an atomic layer deposition process. The first spacer layer may have, for example, a thickness identical to a width of a linear pattern of an active region.

The first spacer layer may be, for example, anisotropically etched to form a first spacer 114. The first spacer 114 may be formed, for example, on a sidewall of the second temporary mask pattern 112 to have a linear shape extending in the first direction.

In this embodiment, because an etch stop layer is not formed under the first spacer 114, a process of etching the etch stop layer may not be performed, to thereby prevent a process failure of the process for etching the etch stop layer.

The second temporary mask pattern 112 may be removed from the substrate 100 such that the first spacer 114 remains on the first temporary mask layer 110. The second temporary mask pattern 112 may be readily removed from the substrate 100 by, for example, an ashing and strip process.

As illustrated in the figure, the first spacer 114 may have, for example, a width identical to a width of a linear pattern to be formed. The spaced distance between the first spacers 114 may, for example, be about three times greater than a width of a linear pattern to be formed.

Figure 4C:
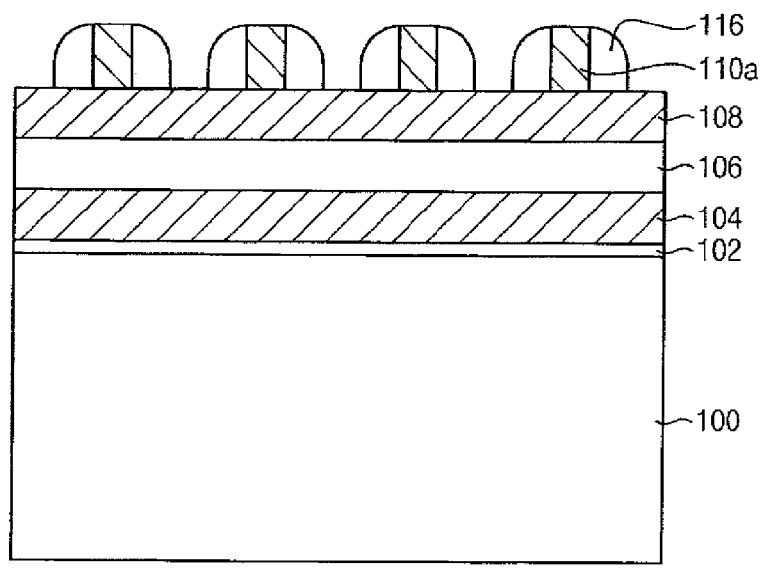

Referring to FIG. 4C, the first temporary mask layer 110 may, for example, be etched using the first spacer 114 as an etching mask to form a first temporary mask pattern 110*a* on the second hard mask layer 108. The first temporary mask pattern 110*a* may have, for example, a width identical to a width of a linear pattern to be formed. Then, the first spacer 114 may be removed from the substrate 100.

A second spacer layer (not illustrated) may be formed along surfaces of the first temporary mask pattern 110*a* and the second hard mask layer 108. The second spacer layer may be formed using, for example, silicon oxide. The second spacer layer may be formed by, for example, an atomic layer deposition process. The second spacer layer may have, for example, a thickness identical to a width of a linear pattern to be formed.

The second spacer layer may be, for example, anisotropically etched to form a second spacer 116. The second spacer 116 may be formed, for example, on a sidewall of the first temporary mask pattern 110*a* to have a linear shape extending in the first direction.

Figure 4D:
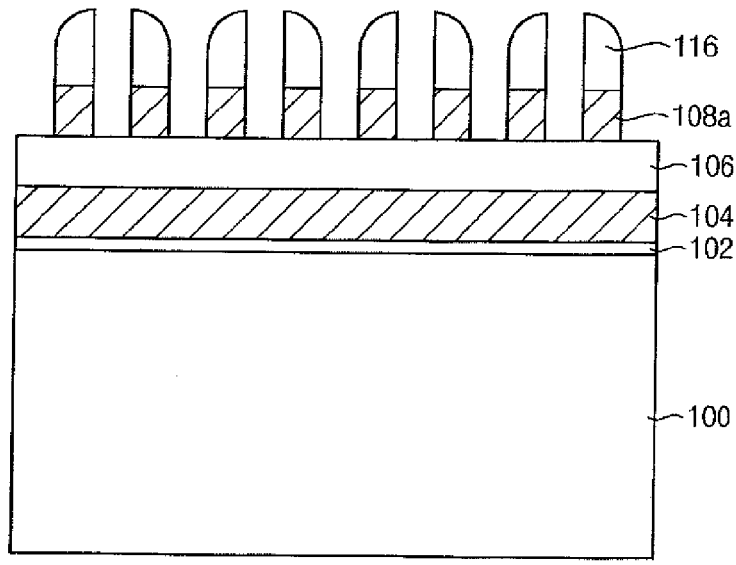

Referring to FIG. 4D, the first temporary mask pattern 110*a* between the second spacers 116 may be removed from the substrate 100. Accordingly, the second spacers 116 having a linear shape extending in the first direction may be spaced apart from another.

The second hard mask layer 108 may, for example, be etched using the second spacer 116 as an etching mask to form a second hard mask pattern 108*a* on the first insulation layer 106.

Figure 4E:
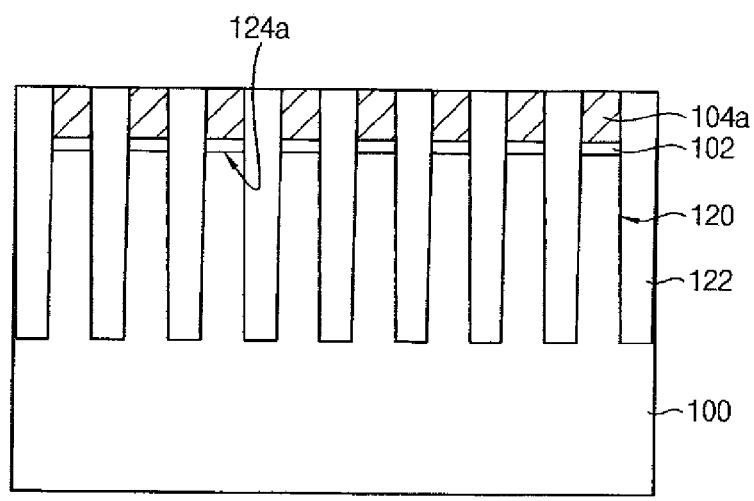
Figure 5A:
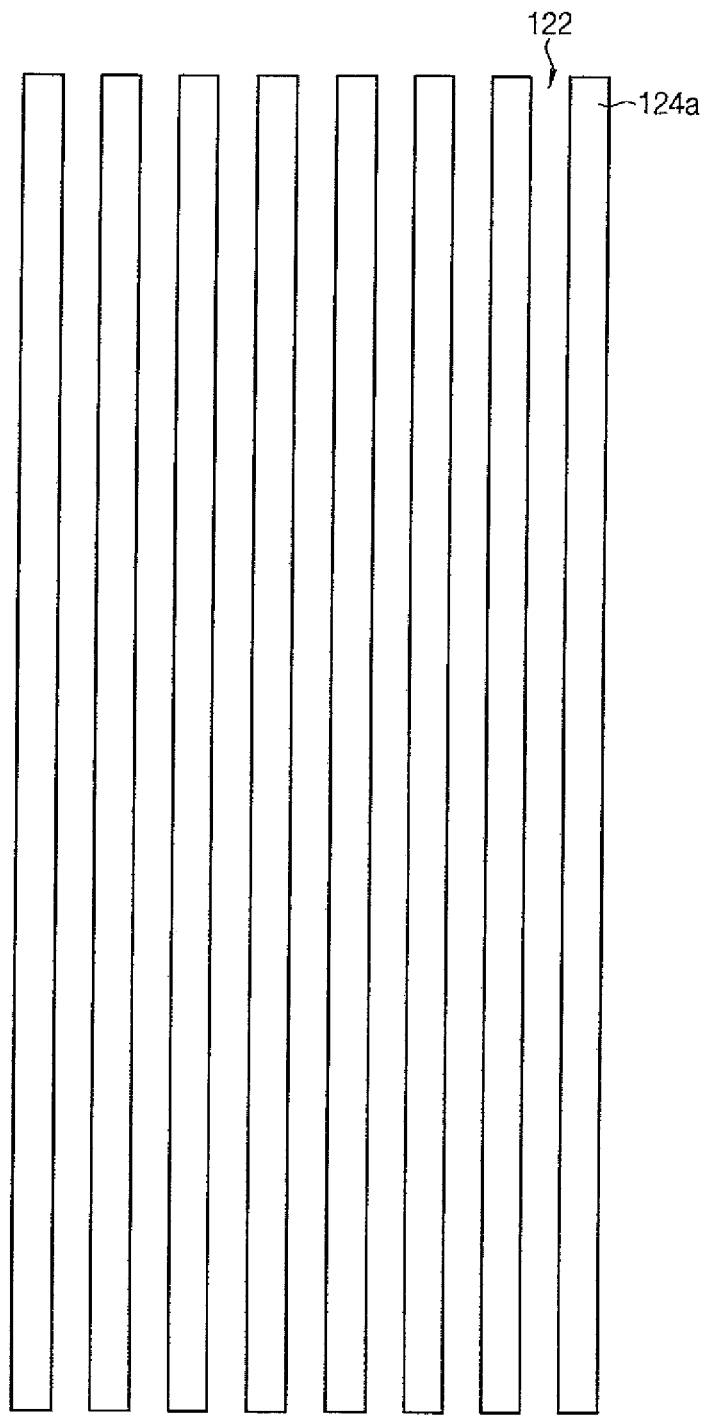
FIGS. 5A to 5D are plan views illustrating a method of manufacturing the NAND flash memory device in FIG. 3A.

Referring to FIGS. 4E and 5A, the first insulation layer 106 and the first hard mask layer 104 may, for example, be etched using the second hard mask pattern 108*a* to form a first insulation layer pattern and a first hard mask pattern 104*a*.

The first hard mask pattern 104*a* may serve as an etching mask for forming the isolation trench.

The pad insulation layer 102 and the substrate 100 may, for example, be etched using the first hard mask pattern 104*a* to form the isolation trench 120. For example, while performing the etch process, the first insulation layer pattern on the first hard mask pattern 104*a* may be removed together.

The isolation trench 120 may be filled with an insulation material such as, for example, silicon oxide. For example, a planarization process may be performed on the isolation material until the first hard mask pattern 104*a* is exposed. The planarization process may include, for example, a chemical mechanical polishing process or an etch back process. Accordingly, a preliminary isolation layer pattern 122 may be formed in the trench 120.

In here, a portion of the substrate 100 protruding between the isolation trenches 120 may be a linear pattern 124*a*. Accordingly, the pad insulation layer 102 and the first hard mask pattern 104*a* may be formed on the linear pattern 124*a*.

Figure 4F:
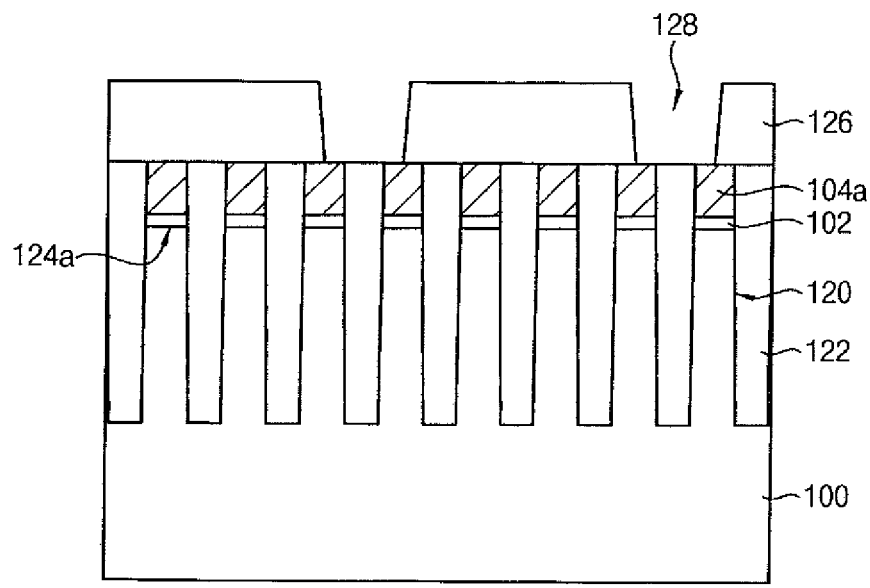
Figure 5B:
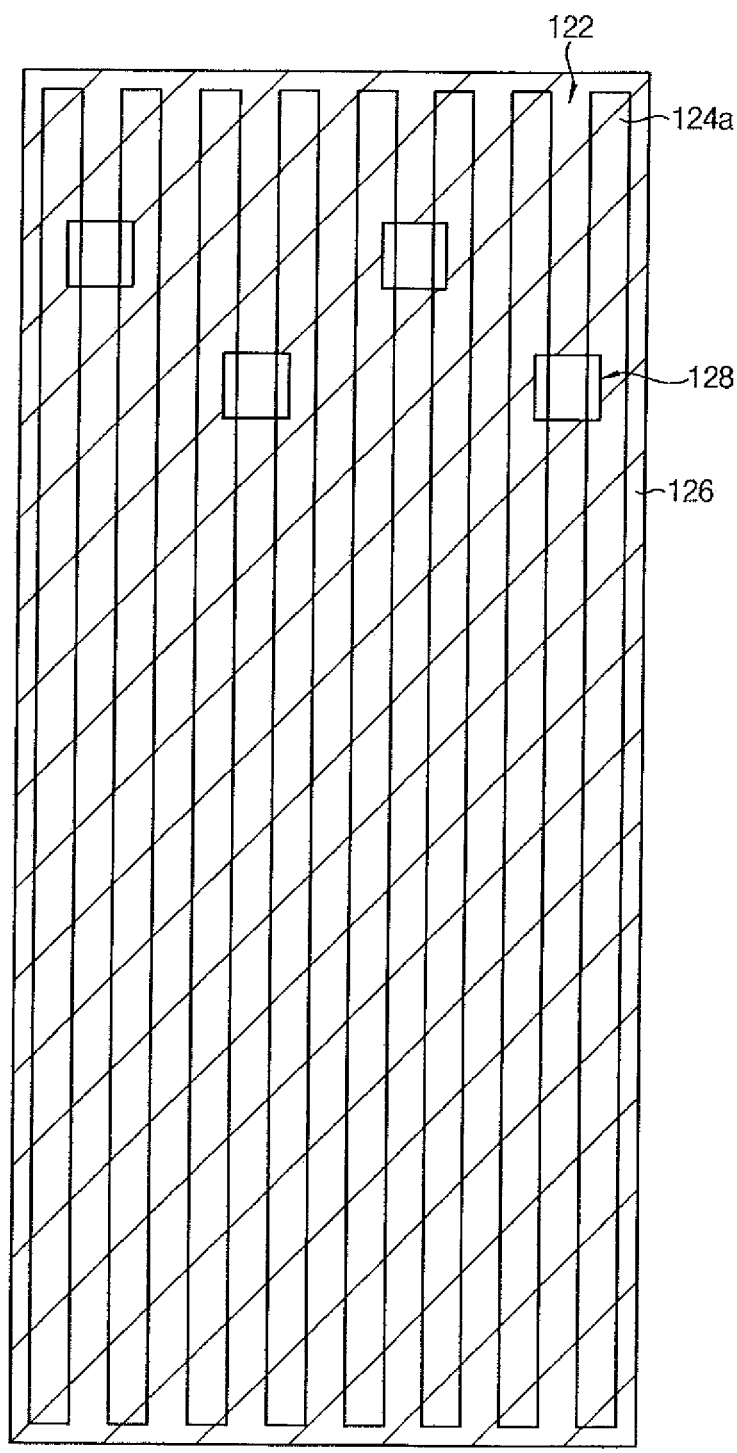

Referring to FIGS. 4F and 5B, a photoresist layer may be coated on the preliminary isolation layer pattern 122 and the first hard mask pattern 104*a*. For example, a photolithography process may be performed to form a photoresist pattern 126 that selectively exposes an upper surface of the preliminary isolation layer pattern 122 at a position for a bridge pattern to be formed in the active region. As illustrated in the figures, the exposing portion 128 of the photoresist pattern 126 may be formed to have, for example, a width greater than a width of the bridge pattern extending along a second direction. Boundary regions of the mask patterns 104*a* may be exposed by the exposing portion 128 of the photoresist pattern 126.

The preliminary isolation layer pattern 122 and the first hard mask pattern 104*a* may have, for example, a flat upper surface, to thereby provide a relatively wide margin of a photolithography process. Accordingly, a failure that can occur when the photolithography process is performed may be reduced.

Figure 4G:
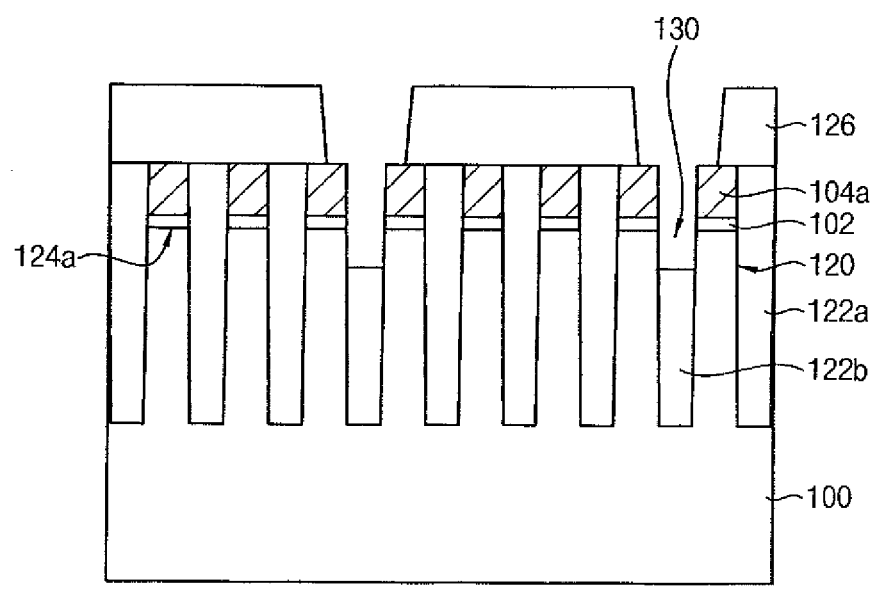
Figure 5C:
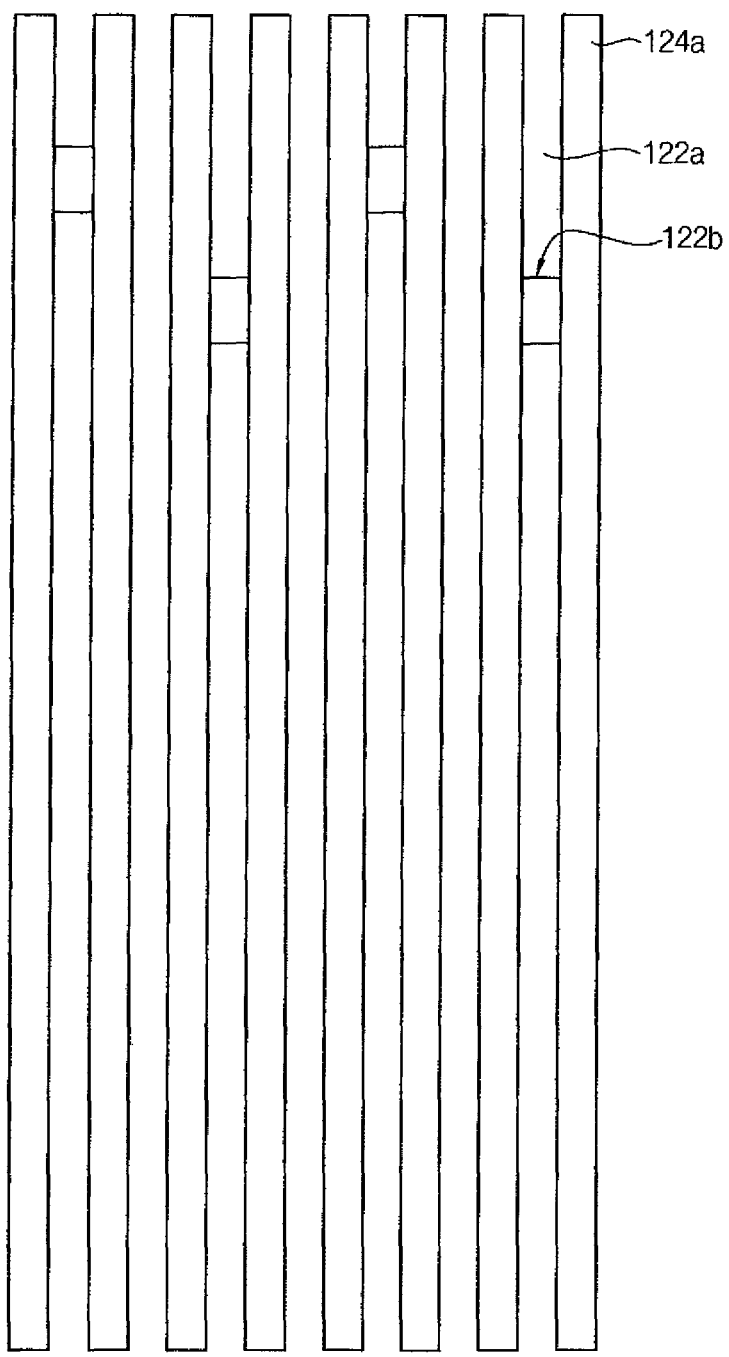

Referring to FIGS. 4G and 5C, the preliminary isolation layer pattern 122 may, for example, be selectively etched using the photoresist pattern 126 and the first hard mask pattern 104*a* as an etching mask to remove partially the preliminary isolation layer pattern 122 between the first hard mask patterns 104*a*. The etching process may be performed to form an opening 130.

The etching process may be performed until, for example, an upper sidewall of the linear pattern 124*a* is exposed through the opening 130. A following process may be performed on a bridge pattern that makes contact with the exposed upper sidewall of the linear pattern 124*a*. Therefore, a depth of the exposed upper sidewall of the linear pattern 124*a* may be, for example, identical to or greater than a depth of the bride pattern to be formed.

The preliminary isolation layer pattern 122 may be etched to form, for example, a first isolation layer pattern 122*a* in the field region and a second isolation layer pattern 122*b* near the bridge pattern in the active region. That is, the isolation layer pattern 122 may be etched to be the second isolation layer pattern 122*b*.

For example, the first isolation layer pattern 122*a* may have a first upper surface and the second isolation layer pattern 122*b* may have a second upper surface lower than the first upper surface.

Figure 4H:
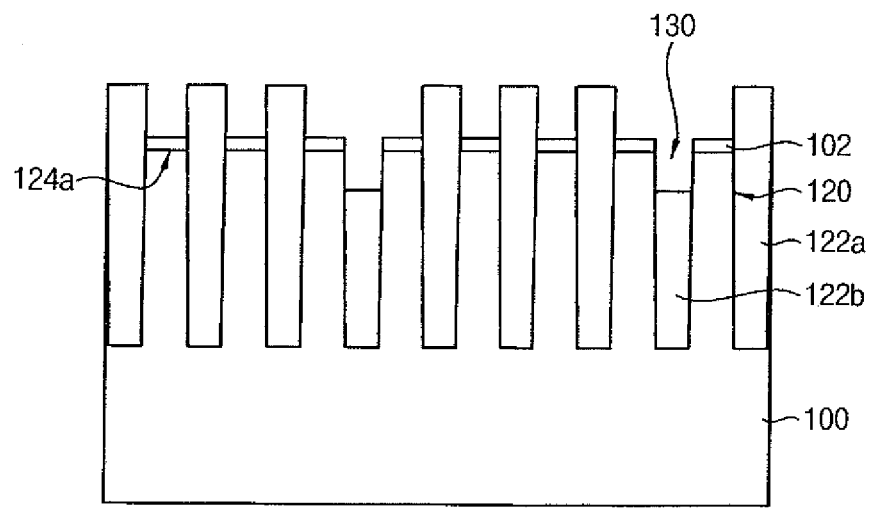

Referring to FIG. 4H, the photoresist pattern 126 may be removed by, for example, an ashing and strip process. Then, the first hard mask pattern 104*a* may be removed from the substrate 100.

The pad insulation layer 102 may be coated on the linear pattern 124*a* in the active region. Accordingly, the linear pattern 124a may not be exposed outside and the sidewall wall of the linear pattern 124a may be exposed in the opening 130.

Figure 4I:
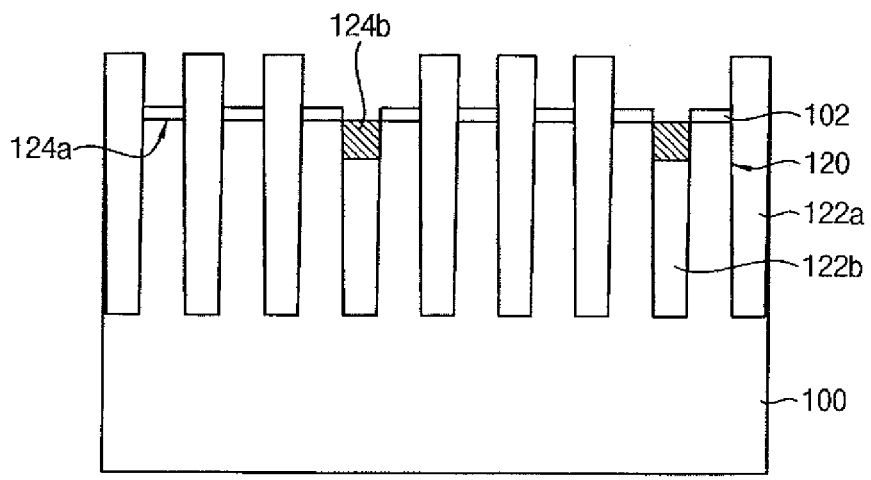

For example, referring to FIG. 4I, a selective epitaxial growth process may be performed using the exposed sidewall of the linear pattern 124a as a seed. Accordingly, single-crystalline semiconductor may be grown from, for example, the exposed sidewalls of the linear patterns 124a opposite to each other to form a bridge pattern 124b within the opening 130.

The selective epitaxial growth process may include, for example, reduced pressure chemical vapor deposition process (RPCVD), low pressure chemical vapor deposition process (LPCVD), ultra high vacuum chemical vapor deposition process (UHVCVD), metal organic chemical vapor deposition process (MOCVD), etc.

The bridge pattern 124b may be grown from, for example, the sidewall of the linear pattern 124a. Accordingly, the bridge pattern 124b may have, for example, a crystal direction different from the linear pattern 124a that is formed by etching the semiconductor substrate 100. That is, the linear pattern 124a may have a first crystal direction and the bridge pattern 124b may have a second crystal direction different from the second crystal direction.

The bridge pattern 124b may have, for example, an upper surface coplanar with the upper surface of the first isolation layer pattern 122a. Alternatively, the bridge pattern 124b may have, for example, the upper surface lower or higher than the upper surface of the first isolation layer pattern 122a. Because the bridge pattern 124b serves as a pad for forming a common bit line contact, the height of the upper surface of the bridge pattern 124b may not be limited.

As such, the bridge pattern 124b may not be formed by etching the semiconductor substrate 100, to thereby prevent a failure of the photolithography process. Further, the height of the second isolation layer pattern 122b under the bridge pattern 124b may be selected to control the thickness of the bridge pattern 124b.

Figure 4J:
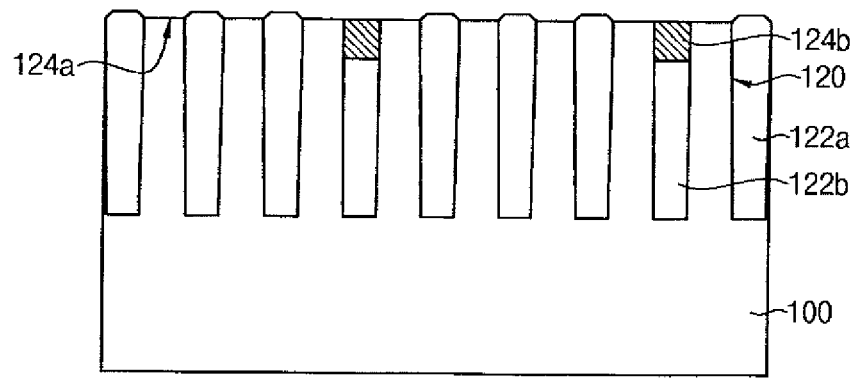
Figure 5D:
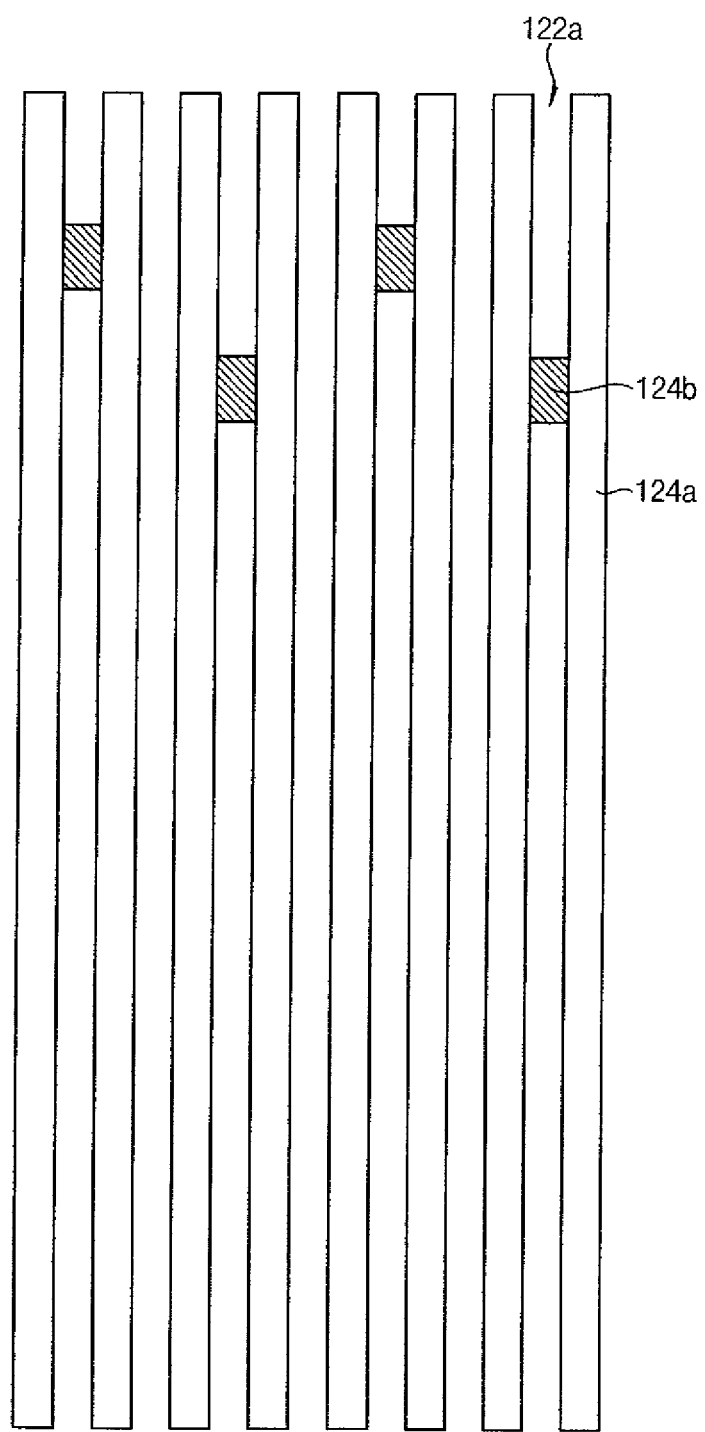

Referring to FIGS. 4J and 5D, the pad insulation layer 102 may, for example, be removed to expose the upper surface of the semiconductor substrate 100 in the active region. For example, while the pad insulation layer 102 is removed, an upper portion of the first isolation layer pattern 122a may be removed with it together.

Hereinafter, a method of manufacturing the NAND flash memory device in FIG. 3A will be explained.

FIGS. 6A to 6D are cross-sectional views illustrating a method of manufacturing the NAND flash memory device in FIG. 3A.

First, the processes as explained with reference to FIGS. 4A to 4E may be performed to form the structure in FIG. 4E.

Figure 6A:
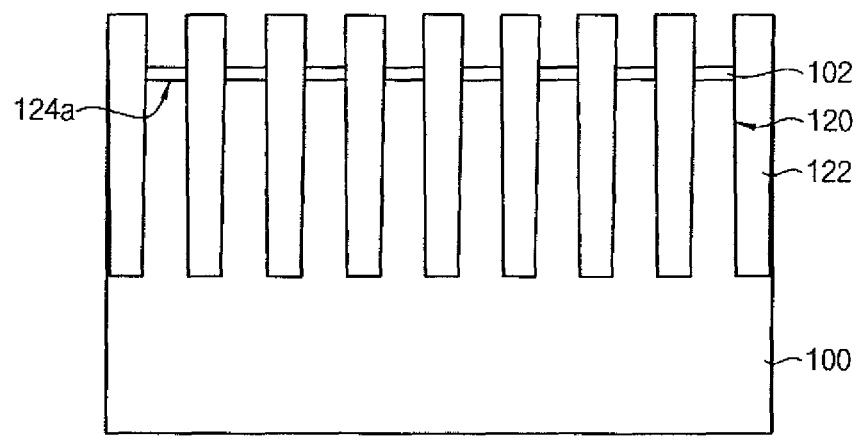
FIGS. 6A to 6D are cross-sectional views illustrating a method of manufacturing the NAND flash memory device in FIG. 3A.

Referring to FIG. 6A, the first hard mask pattern 104a may be removed from the substrate 100.

The process may be performed to, for example, expose the pad insulation layer 102 on the linear pattern in the active region. The isolation trench 120 may be filled with the preliminary isolation layer pattern 122.

Figure 6B:
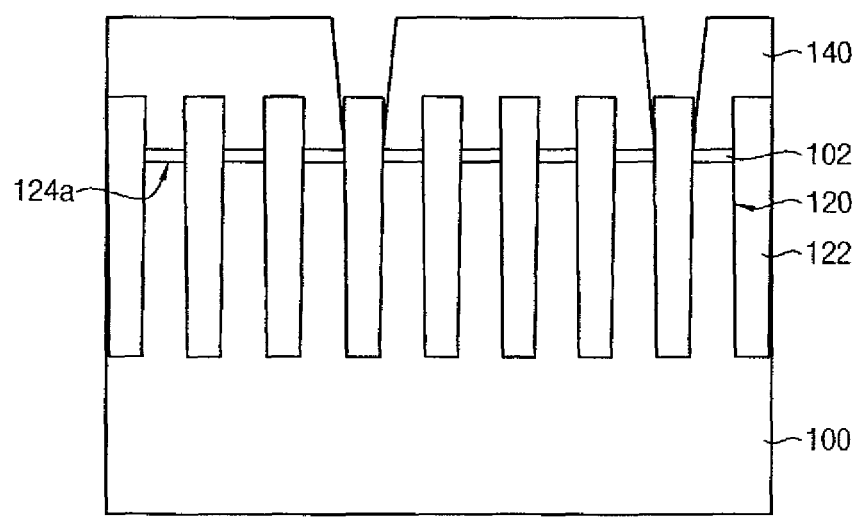

For example, referring to FIG. 6B, a photoresist layer may be coated on the pad insulation layer 102 and the preliminary isolation layer pattern 122. For example, a photolithography process may be performed to a photoresist pattern 140 that selectively exposes the preliminary isolation layer pattern 122 at a position where a bridge pattern is to be formed in the active region.

Figure 6C:
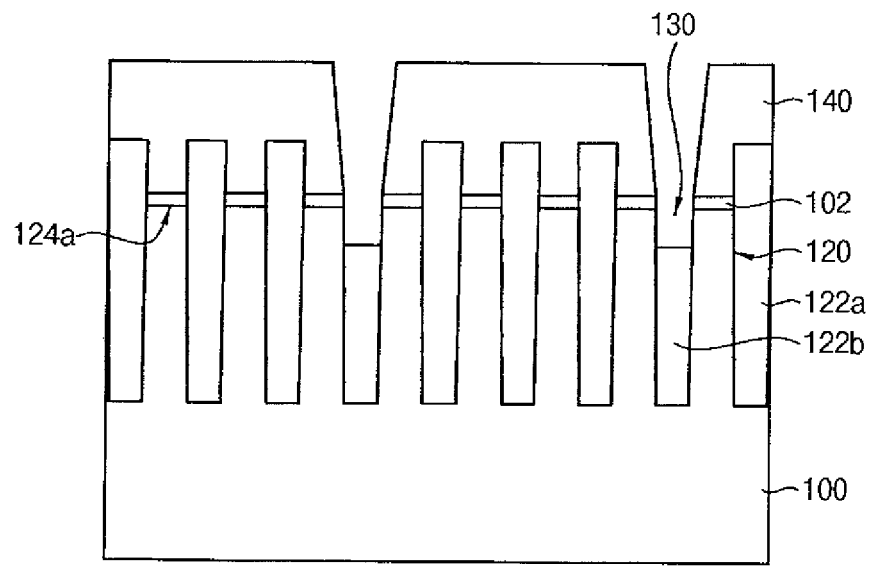

Referring to FIG. 6C, the preliminary isolation layer pattern 122 may be etched using, for example, the photoresist pattern 140 as an etching mask. The preliminary isolation layer pattern 122 may be, for example, partially removed to form an opening 130 at a position where a bridge pattern is formed.

Accordingly, the preliminary isolation layer pattern 122 may be etched to form a first isolation layer pattern 122a in the field region and a second isolation layer pattern 122b in the active region. That is, the preliminary isolation layer pattern 122 may be partially etched to be the second isolation layer pattern 122b.

For example, the first isolation layer pattern 122a may have a first upper surface and the second isolation layer pattern 122b may have a second upper surface lower than the first upper surface.

Figure 6D:
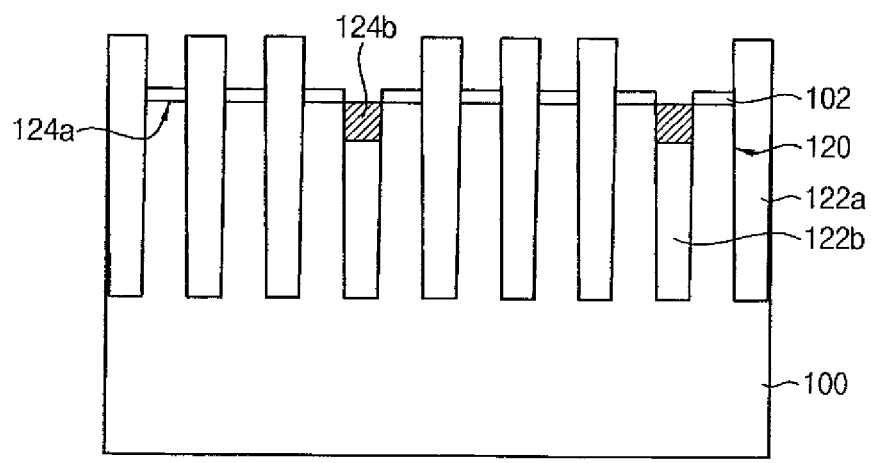

Referring to FIG. 6D, the photoresist pattern may be removed by, for example, an ashing and strip process.

For example, a selective epitaxial growth process may be performed using the exposed sidewall of the linear pattern 124a as a seed. Accordingly, a single-crystalline semiconductor may be grown from the exposed sidewalls of the linear patterns 124a opposite to each other to form a bridge pattern 124b that partially fills the opening 130.

The bridge pattern 124b may, for example, be grown from the sidewall of the linear pattern 124a. Accordingly, the bridge pattern 124b may have, for example, a crystal direction different from the linear pattern 124a that is formed by etching the semiconductor substrate 100. That is, the linear pattern 124a may have a first crystal direction and the bridge pattern 124b may have a second crystal direction different from the second crystal direction.

Figure 4K:
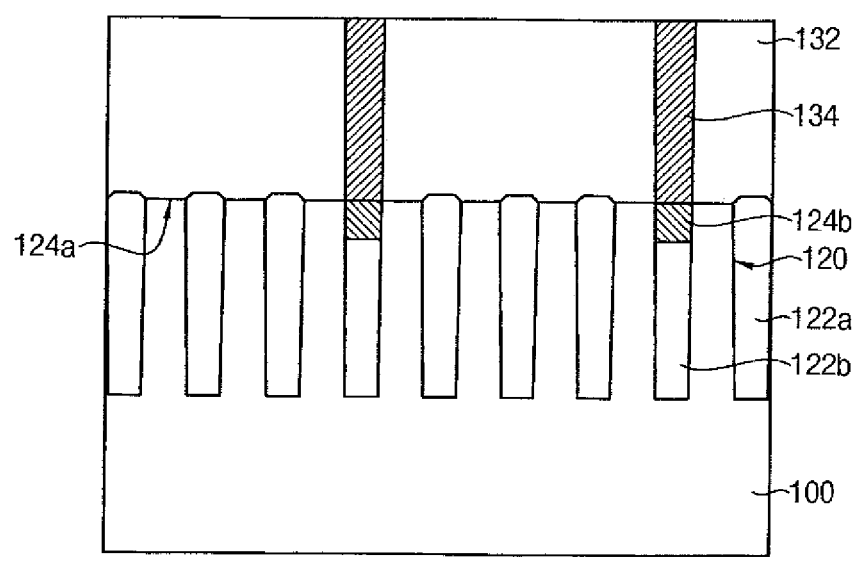

Then, the processes which are the same as those as explained with reference to FIGS. 4J and 4K may be performed to complete the NAND flash memory device.

Hereinafter, a method of manufacturing the NAND flash memory device in FIG. 3A will be explained.

FIGS. 7A to 7D are cross-sectional views illustrating a method of manufacturing the NAND flash memory device in FIG. 3A.

First, the processes as explained with reference to FIGS. 4A to 4E may be performed to form the structure in FIG. 4E.

Figure 7A:
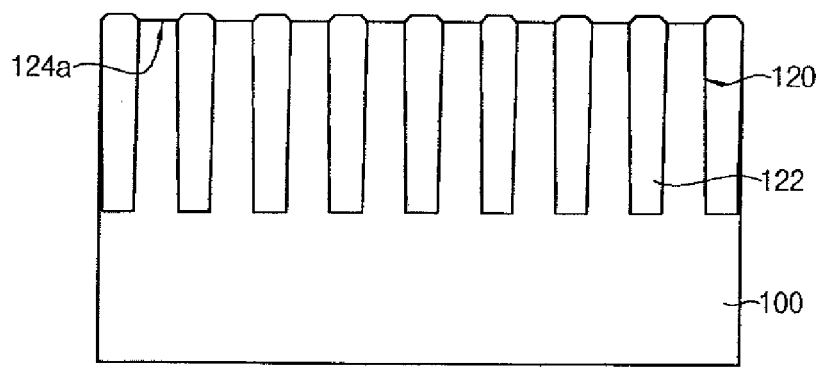
FIGS. 7A to 7D are cross-sectional views illustrating a method of manufacturing the NAND flash memory device in FIG. 3A.

Referring to FIG. 7A, the first hard mask pattern 104a and the pad insulation layer 102 may, for example, be removed from the substrate 100 to expose the upper surface of the active region. For example, while the pad insulation layer 102 is removed, an upper portion of the preliminary isolation layer pattern 122 may be removed with it together. The process may be performed to form a linear pattern 124a in the active region.

For example, although it is not illustrated in the figures, a tunnel oxide layer, a charge storage layer, a blocking dielectric layer and a control gate electrode layer may be formed on the exposed active region. Then, the layers may be patterned to form a first gate structure for a cell transistor and a second gate structure for a selection transistor, respectively. For example, N type impurities may be doped into the active region in both sides of the first and second gate structures to form impurity regions. Accordingly, a cell transistor, string selection transistors and ground selection transistors may be formed and then a common source line may be formed to be electrically connected to a source region of the ground selection transistor.

Figure 7B:
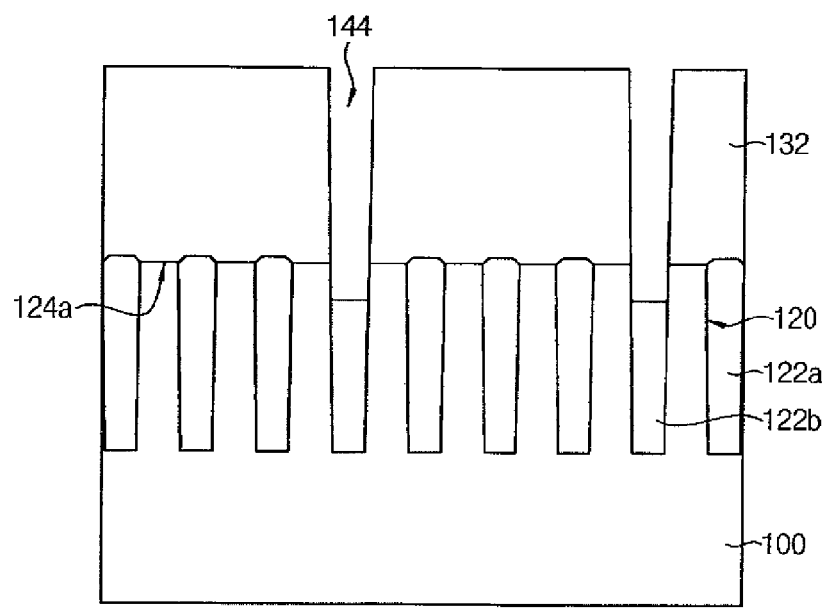

Referring to FIG. 7B, an insulation interlayer 132 may be formed to cover the first and second gate structures and the common source line.

An etch mask pattern (not illustrated) may be formed on the insulation interlayer 132. The etch mask pattern may, for example, expose a region where a bridge pattern is to be formed in the active region.

The insulation interlayer 132 may, for example, be etched using the etch mask pattern as an etching mask, and then, the preliminary isolation layer pattern 122 may be etched to form an opening 144 in the insulation interlayer 132.

Accordingly, the preliminary isolation layer pattern 122 may be etched to form a first isolation layer pattern 122a in the field region and a second isolation layer pattern 122b in the active region. Additionally, an upper sidewall of the linear pattern 124a in the active region may, for example, be exposed through a lower sidewall of the opening 144.

Figure 7C:
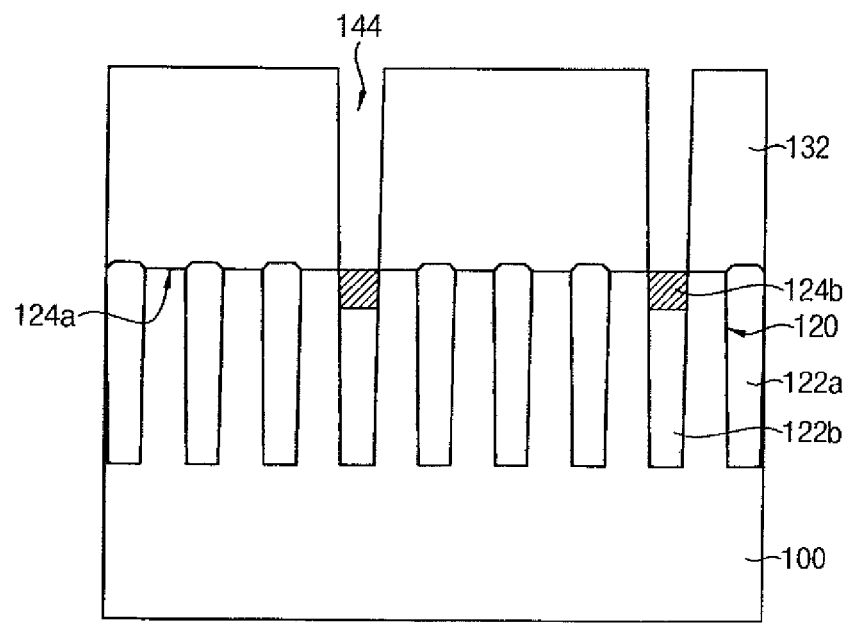

For example, referring to FIG. 7C, a selective epitaxial growth process may be performed using the exposed sidewall of the linear pattern 124a as a seed. Accordingly, single-crystalline semiconductor may be, for example, grown from the exposed sidewalls of the linear patterns 124a opposite to each other to form a bridge pattern 124b that fills a lower portion of the opening 130.

The bridge pattern 124b may be, for example, grown from the sidewall of the linear pattern 124a. Accordingly, the bridge pattern 124b pattern 124b may have, for example, a crystal direction different from the linear pattern 124a that is formed by etching the semiconductor substrate 100. That is, the linear pattern 124a may have a first crystal direction and the bridge pattern 124b may have a second crystal direction different from the second crystal direction.

Figure 7D:
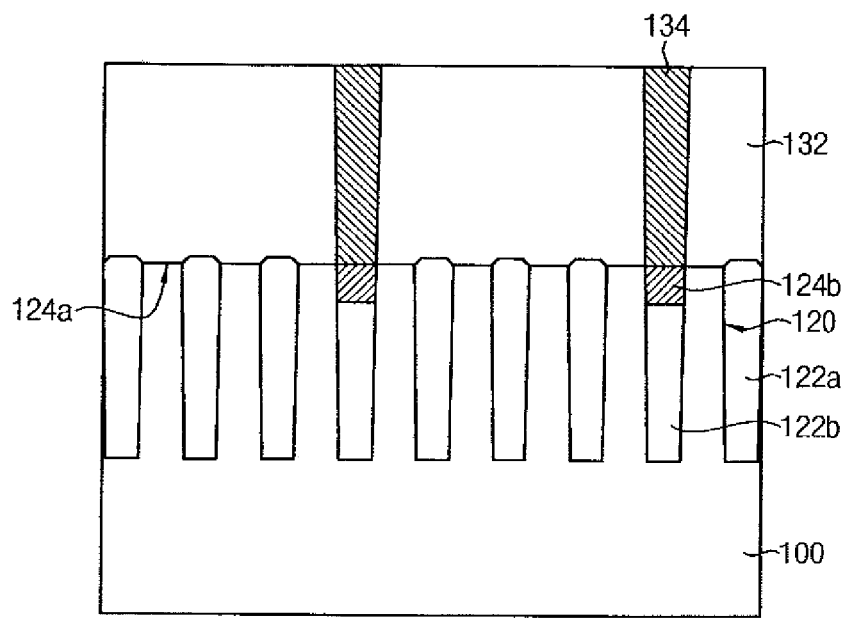

Referring to FIG. 7D, the opening 144 including the bridge pattern 124b formed therein may be filled with a conductive layer to form a common bit line contact 134.

The common bit line contact 134 may make contact with the bridge pattern 124b.

Then, a bit line (not illustrated) may be formed on the insulation interlayer 132 to make contact with an upper surface of the common bit line contact 134.

Figure 8:
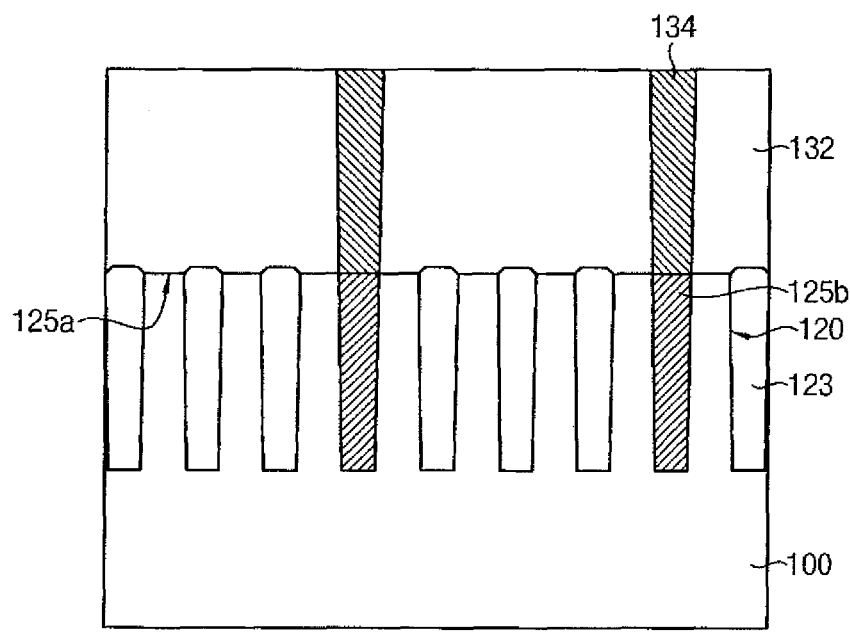

FIG. 8 is a cross-sectional view illustrating a NAND flash memory device in accordance with an example embodiment.

The NAND flash memory device of the present embodiment is substantially the same as the NAND flash memory device of FIG. 3A except for a bridge pattern. The plan view of the NAND flash memory device of the present embodiment is substantially the same as the NAND flash memory device of FIG. 3A. Thus, the same reference numerals will be used to refer to the same or like elements as those described for the NAND flash memory device of FIG. 3A and any further repetitive explanation concerning the above elements will be omitted.

Referring to FIG. 8, an active region of a semiconductor substrate 100 may include, for example, linear patterns 125a extending in a first direction and bridge patterns 125b extending in a second direction perpendicular to the first direction to bind the linear patterns 125a as a unit.

The isolation trench 120 may be provided between the linear patterns 125a in the semiconductor substrate 100. The isolation trench 120 may have, for example, a linear shape extending in a first direction. The isolation trenches 120 may be arranged to be spaced apart from one another by a predetermined distance.

An isolation layer pattern 123 may be provided in the isolation trenches 120. The isolation layer pattern 123 may be provided in the isolation trench 120 in, for example, the field region.

A bridge pattern 125b may be provided in the isolation trench 120 in a region other than the field region. In this embodiment, the bridge pattern 125b may, for example, fill completely the isolation trench 120. The active region may include, for example, the linear pattern 125a having a first crystal direction and the bridge pattern 125b having a second crystal direction.

Hereinafter, a method of manufacturing the NAND flash memory device in FIG. 8 will be explained.

Figure 9A:
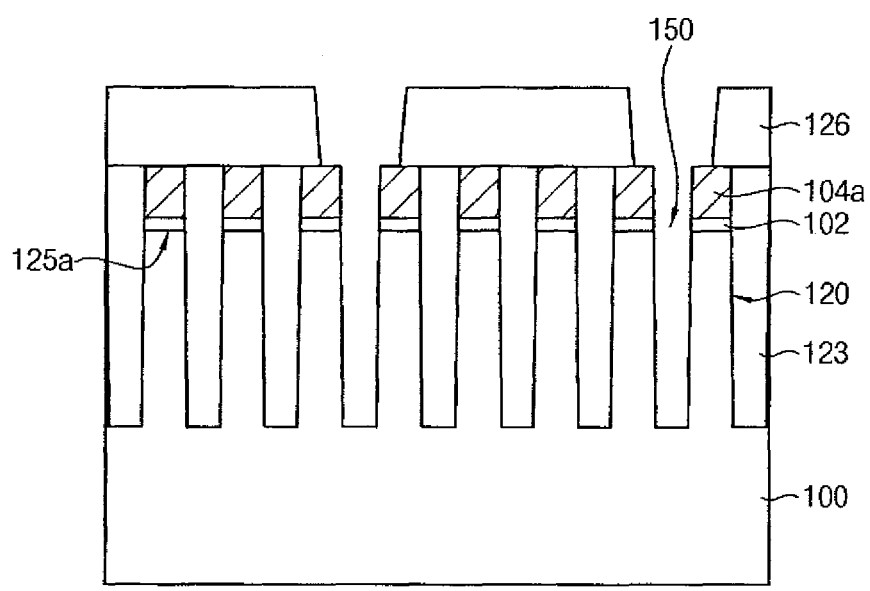
FIGS. 9A and 9B are cross-sectional views illustrating the NAND flash memory device in FIG. 8.
Figure 9B:
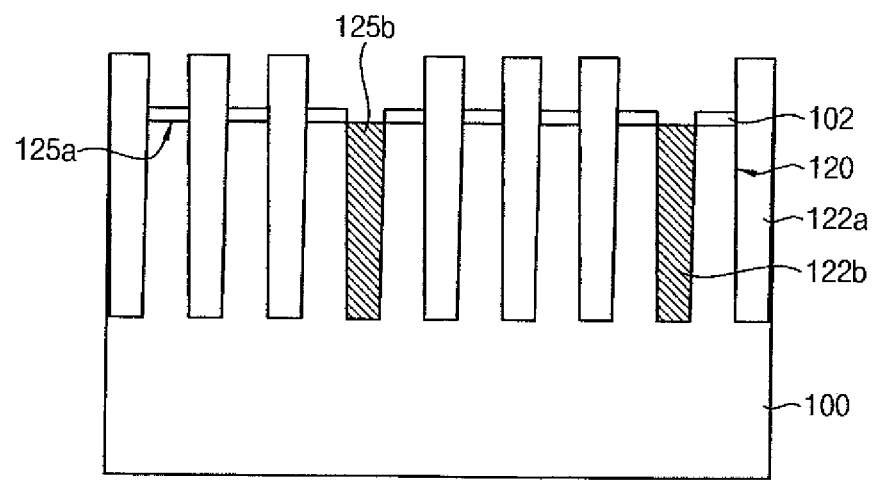

FIGS. 9A and 9B are cross-sectional views illustrating the NAND flash memory device in FIG. 8.

The method of manufacturing the NAND flash memory device according to the present embodiment is substantially the same as for the NAND flash memory device of FIG. 3A except for forming a bridge pattern.

First, the processes as described with reference to FIGS. 4A to 4F may be performed to form the structure in FIG. 4F.

Referring to FIG. 9A, the preliminary isolation layer pattern 122 may be, for example, etched using the photoresist pattern 126 and the first hard mask pattern 104a as an etching mask to form an isolation layer pattern 123 in the isolation region of the substrate.

The etch process may be performed such that the preliminary isolation layer pattern 122 exposed by the first hard mask pattern 104a may, for example, be completely removed to form an opening 150. Accordingly, the semiconductor substrate 100 may be exposed through sidewalls and bottom surface of the opening 150. The sidewall of the linear pattern 125a may, for example, be exposed by the sidewall of the opening 150.

Referring to FIG. 9B, the photoresist pattern 126 may be removed by, for example, an aching and strip process. Then, the first hard mask pattern 104a may be removed from the substrate.

The process may be performed to, for example, expose the pad insulation layer 102 on the linear pattern 125a in the active region. Accordingly, for example, while the upper surface of the linear pattern 125a is not exposed, the semiconductor substrate 100 may be exposed through the sidewalls and the bottom surface of the opening 150.

For example, a selective epitaxial growth process may be performed using the exposed semiconductor substrate 100 as a seed. Accordingly, single-crystalline semiconductor may be, for example, grown from the exposed sidewalls of the linear patterns 125a opposite to each other and the bottom surface of the opening to form a bridge pattern 125b that fill the opening 150. The bridge pattern 125b may connect the linear patterns 125a to each other.

The bridge pattern 125b may be, for example, grown from the sidewall of the linear pattern 125a. Accordingly, the bridge pattern 125b may have, for example, a crystal direction different from the linear pattern 125a. That is, the linear pattern 125a may have a first crystal direction and the bridge pattern 125b may have a second crystal direction different from the second crystal direction.

Then, the processes as described with reference to FIGS. 4J and 4K may be performed to form the memory device in FIG. 8.

Hereinafter, a method of manufacturing the NAND flash memory device in FIG. 8 will be explained.

Figure 10A:
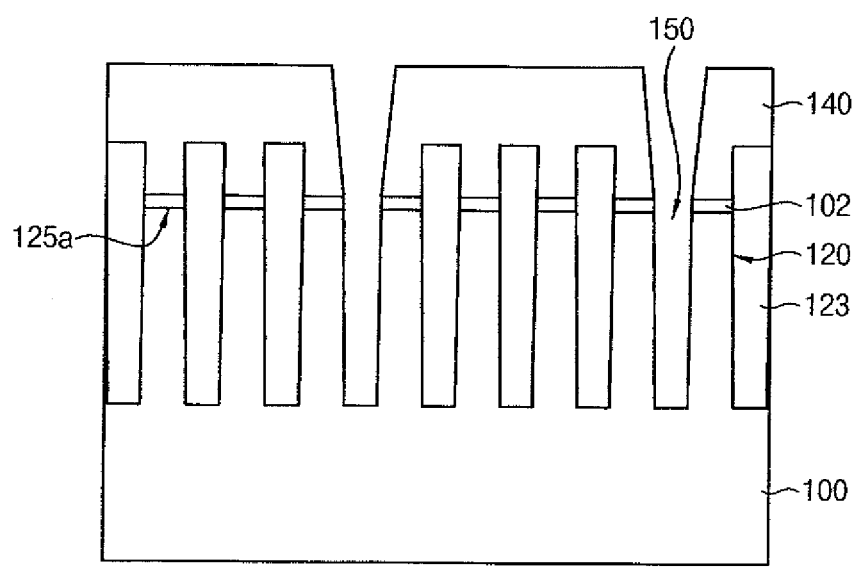
FIGS. 10A and 10B are cross-sectional views illustrating a method of manufacturing the NAND flash memory device in FIG. 8.
Figure 10B:
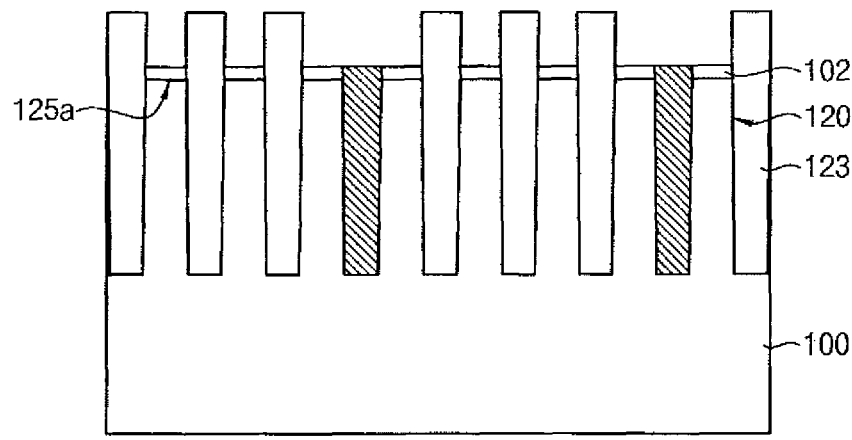

FIGS. 10A and 10B are cross-sectional views illustrating a method of manufacturing the NAND flash memory device in FIG. 8.

First, the processes as explained with reference to FIGS. 4A to 4E and FIGS. 6A and 6B may be performed to form the structure in FIG. 6B.

Referring to FIG. 10A, the preliminary isolation layer pattern may, for example, be etched using the photoresist pattern 140 as an etching mask. The etching process may be performed to form an opening 150 at a position where the bridge pattern is to be formed.

Accordingly, the isolation layer pattern 123 may be formed in the field region and the opening 150 may be formed at a region for the bridge pattern to be formed in the active region.

Thus, the semiconductor substrate 100 may be exposed through the sidewalls and the bottom surface of the opening 150.

Referring to FIG. 10B, the photoresist pattern 140 may be removed by, for example, an ashing and strip process.

Then, for example, a selective epitaxial growth process may be performed using the exposed semiconductor substrate 100 as a seed to form a bridge pattern 125b that connects the linear patterns 125a in the active region.

The bridge pattern 125b may have, for example, a crystal direction different from the linear pattern 125a. That is, the linear pattern 125a may have a first crystal direction and the bridge pattern 125b may have a second crystal direction different from the first crystal direction.

Then, the processes which are the same as those as explained with reference to FIGS. 4J and 4K may be performed to complete the NAND flash memory device.

Figure 11A:
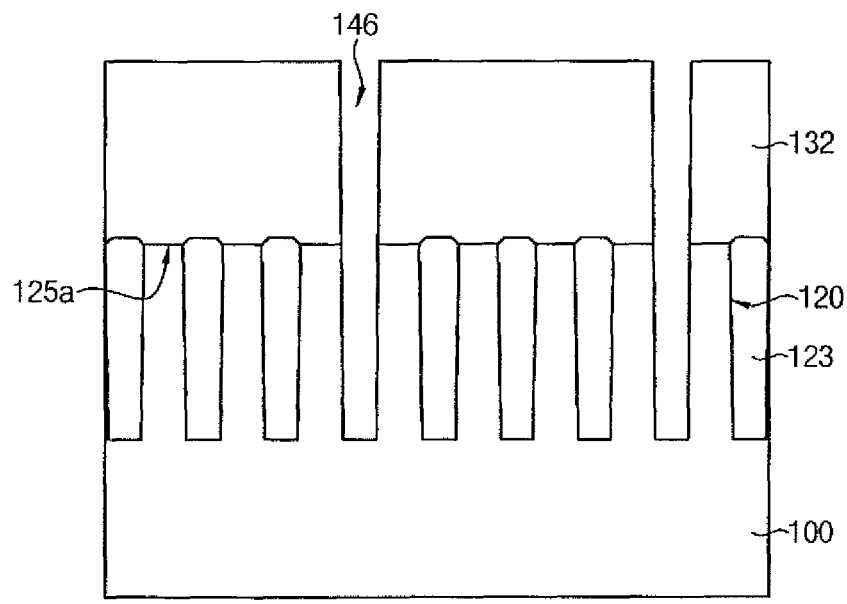
FIGS. 11A to 11C are cross-sectional views illustrating a method of manufacturing the NAND flash memory device in FIG. 8.
Figure 11B:
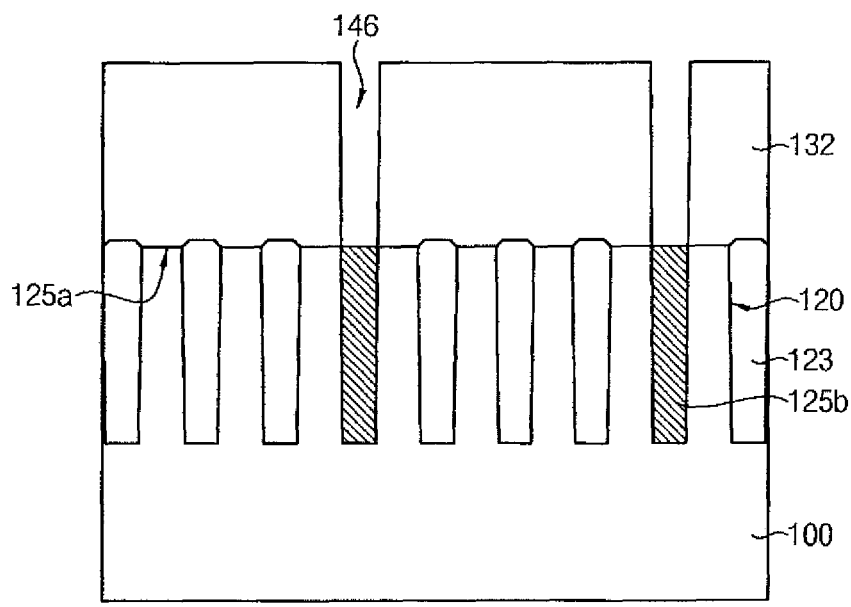
Figure 11C:
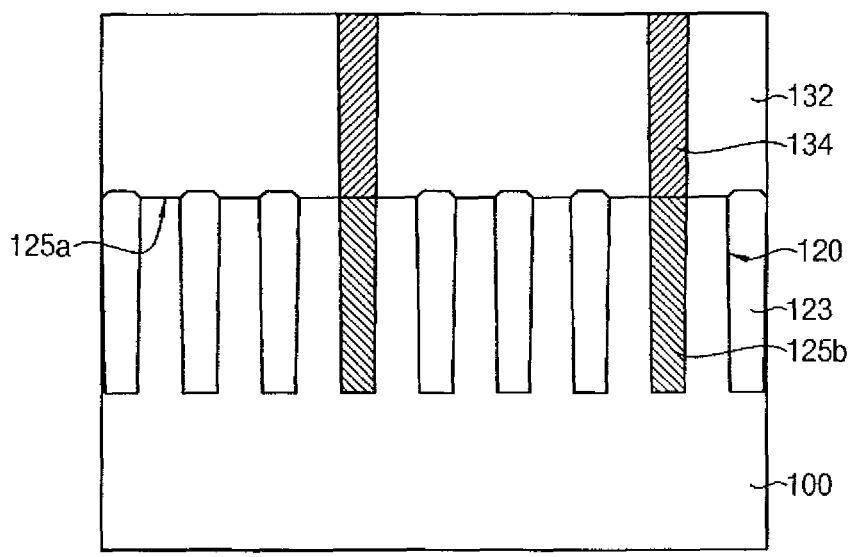

FIGS. 11A to 11C are cross-sectional views illustrating a method of manufacturing the NAND flash memory device in FIG. 8.

First, the processes as explained with reference to FIGS. 4A to 4E and FIG. 7A may be performed to form the structure in FIG. 7A.

Referring to FIG. 11A, an insulation interlayer 132 may be formed to cover the first and second gate structures and the common source line.

An etch mask pattern (not illustrated) may be formed on the insulation interlayer 132. The etch mask pattern may, for example, selectively expose a region where a bridge pattern is to be formed in the active region.

For example, the insulation interlayer 132 may be etched using the etch mask pattern as an etching mask, and then, the preliminary isolation layer pattern may be etched to form an opening 146 in the insulation interlayer 132.

The etching process may be performed to, for example, completely remove the preliminary isolation layer pattern 122 at a position for the bridge pattern to be formed in the active region. As a result, a first isolation layer pattern 123 may be formed, for example, in the field region and an opening 146 may be formed in the active region. The semiconductor substrate 100 may be exposed through a sidewall and a bottom surface of the opening 146.

For example, referring to FIG. 11B, a selective epitaxial growth process may be performed using the exposed sidewall of the linear pattern 125a as a seed. Accordingly, single-crystalline semiconductor may, for example, be grown from the exposed sidewalls of the linear patterns 125a opposite to each other to form a bridge pattern 125b that connects the linear patterns 125a.

The bridge pattern 125b may, for example, be grown from the sidewall of the linear pattern 125a. Accordingly, the bridge pattern 125b may have, for example, a crystal direction different from the linear pattern 125a that is formed by etching the semiconductor substrate 100. That is, the linear pattern 125a may have a first crystal direction and the bridge pattern 125b may have a second crystal direction different from the second crystal direction.

Referring to FIG. 11C, the opening 146 including the bridge pattern 125b formed therein may be filled with a conductive layer to form a common bit line contact 134.

The common bit line contact 134 may make contact with the bridge pattern 125b.

Then, a bit line (not illustrated) may be formed on the insulation interlayer 132 to make contact with an upper surface of the common bit line contact 134.

Figure 12A:
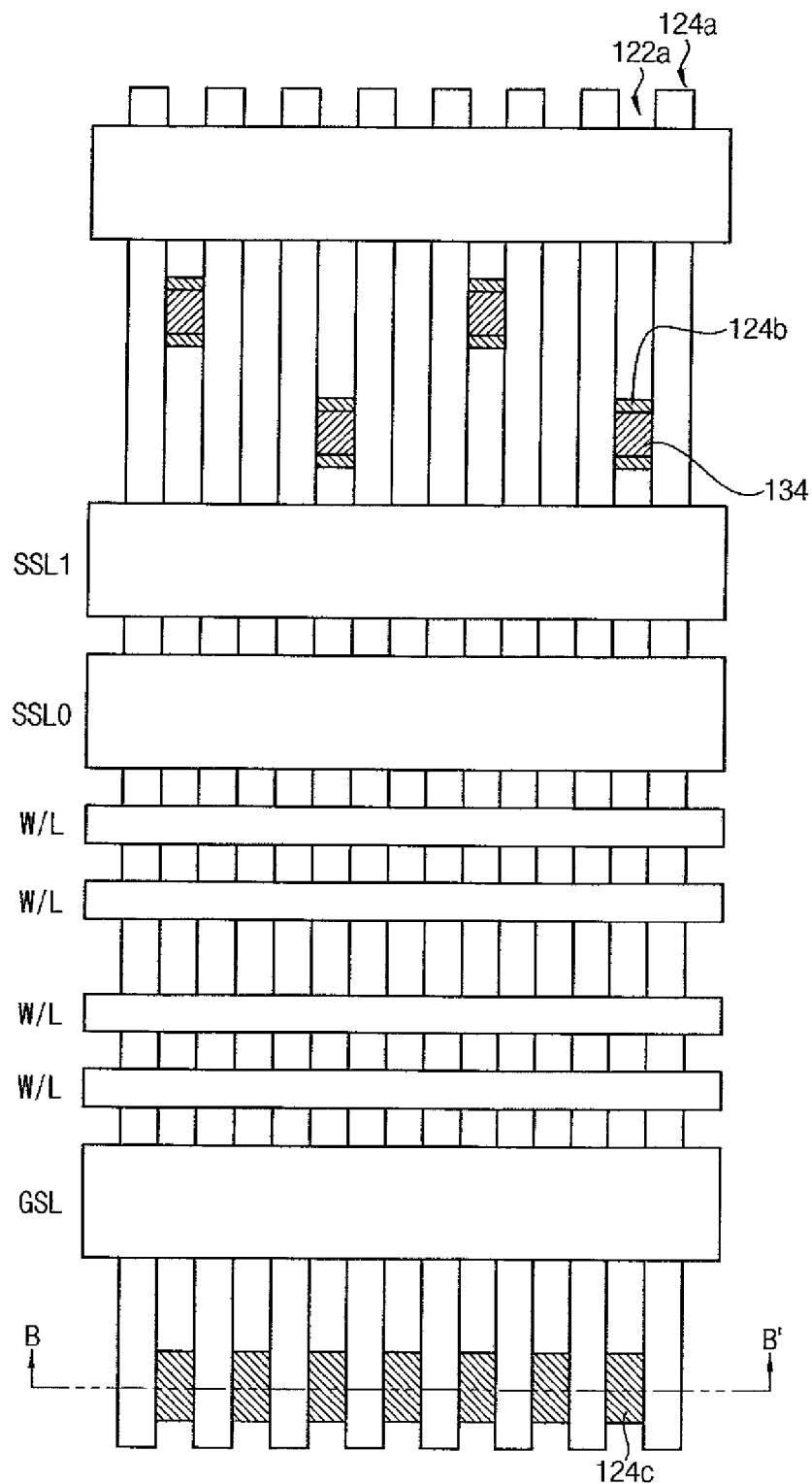
FIG. 12A is a plan view illustrating a cell array of a NAND flash memory device in accordance with an example embodiment.
Figure 12B:
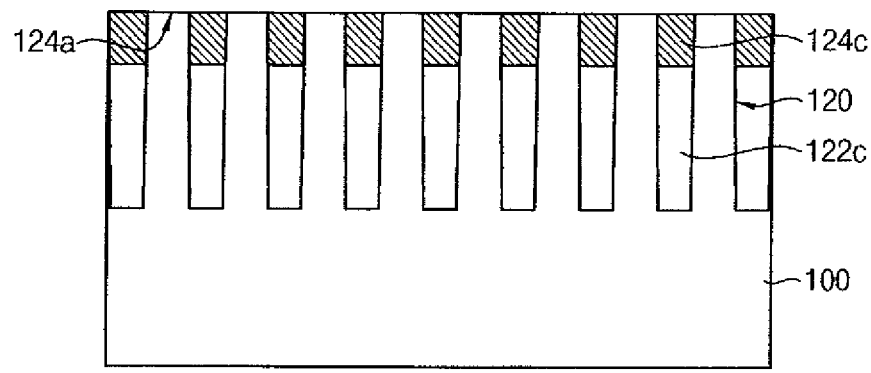
FIG. 12B is a cross-sectional view taken along the B-B' line in FIG. 12A.

FIG. 12A is a plan view illustrating a cell array of a NAND flash memory device in accordance with an example embodiment. FIG. 12B is a cross-sectional view taken along the B-B' line in FIG. 12A.

The NAND flash memory device of the present embodiment is substantially the same as the NAND flash memory device of FIG. 3A except for a common source line.

Referring to FIGS. 12A and 12B, a semiconductor substrate 100 may include, for example, an active region and a field region. For example, the semiconductor substrate 100 may include single-crystalline silicon, silicon germanium, etc.

The active region of the semiconductor substrate 100 may include, for example, linear patterns 124a extending in a first direction, bridge patterns 124b extending in a second direction perpendicular to the first direction to bind end portions of the linear patterns 124a as a unit, and a common source pattern 124c extending in the second direction to bind other portions of the linear patterns 124a to one block unit.

Shapes and structures of the linear pattern 124a and the bridge pattern 124b may be, for example, substantially the same as in the NAND flash memory device of FIG. 3A. Transistors included in a cell string funned in the linear patterns 124a may have, for example, the same shapes and structures as in the NAND flash memory device of FIG. 3A.

A common source line region may be provided in the semiconductor substrate 100 to serve as a common source line. The common source line may include, for example, the linear patterns 124a and common source patterns 124c connecting the linear patterns 124a to each other. The common source line may have, for example, a linear shape extending in the second direction to be connected to the linear pattern 124a and common source patterns 124c.

A third isolation layer pattern 122c may be provided in the isolation trench 120 in the common source line region. The third isolation layer pattern 122c may have, for example, an upper surface lower than that of the first isolation layer pattern.

The common source pattern 124c may be formed on the third isolation layer pattern 122c. The common source pattern 124c may make contact with the upper sidewall of the linear pattern 124a to be connected to the linear patterns 124a. The common source pattern 124c may be formed from the sidewall of the linear patterns 124a by, for example, a selective epitaxial growth process.

In this embodiment, the linear pattern 124a having a first crystal direction and the common source pattern 124c having a second crystal direction may be connected to each other to serve as the common source line.

Hereinafter, a method of manufacturing the NAND flash memory device in FIGS. 12A and 12B will be explained.

Figure 13A:
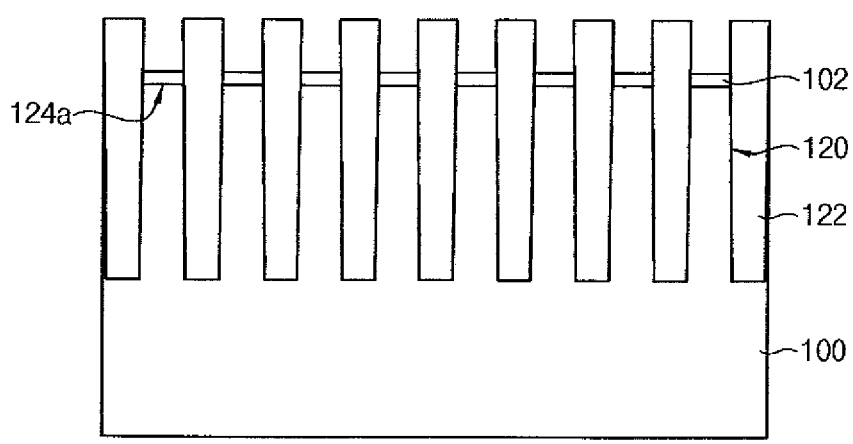
FIGS. 13A to 13C are cross-sectional views illustrating a method of manufacturing the NAND flash memory device in FIGS. 12A and 12B.
Figure 13B:
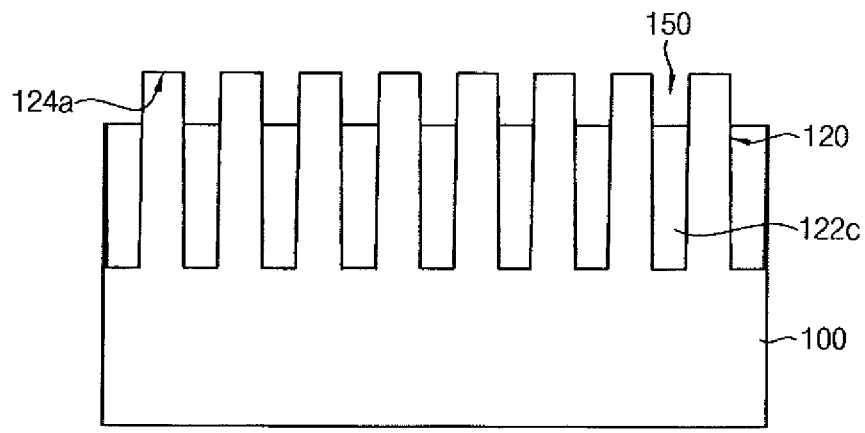
Figure 13C:
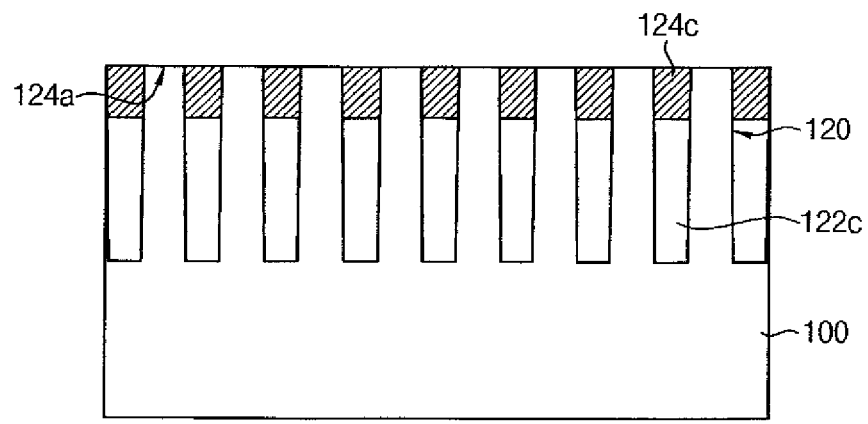
Figure 14A:
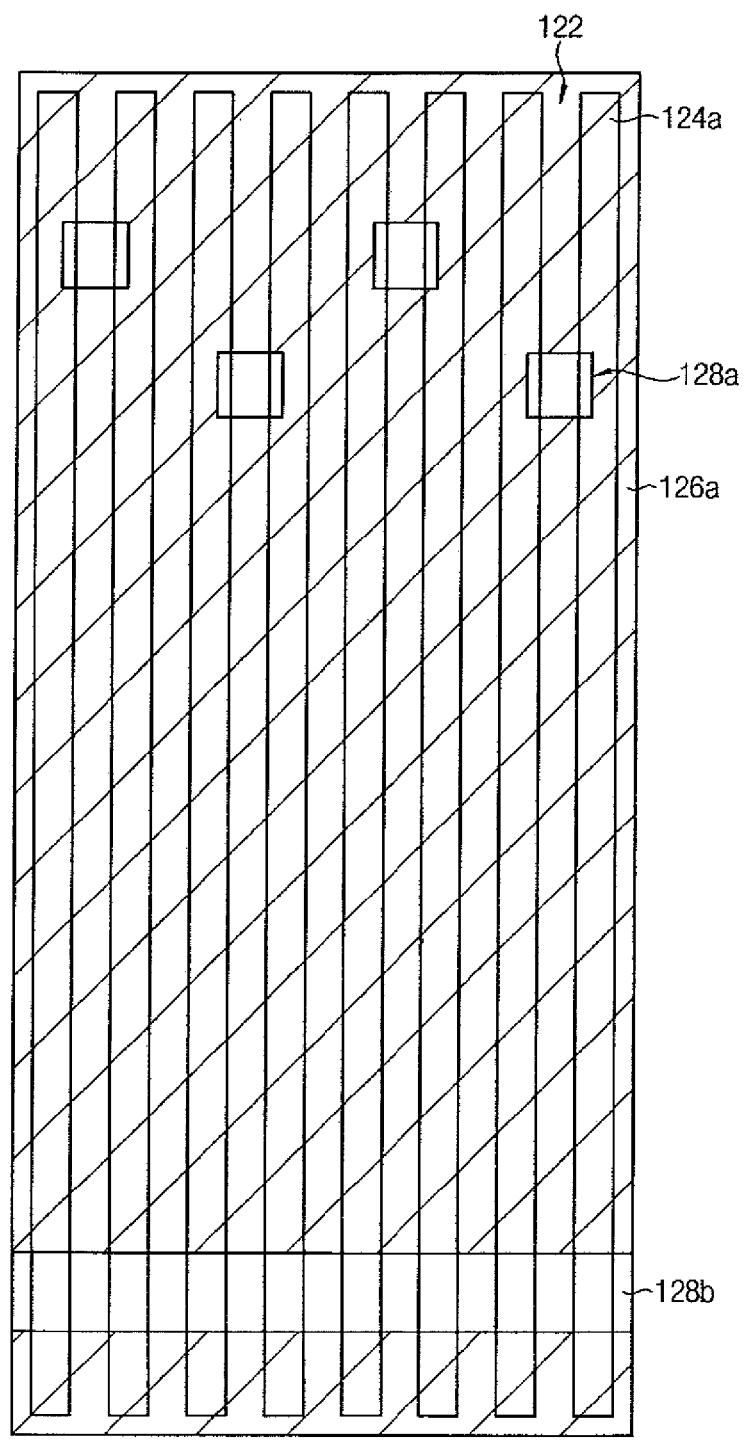
FIGS. 14A to 14B are plan views illustrating a method of manufacturing the NAND flash memory device in FIGS. 12A and 12B.
Figure 14B:
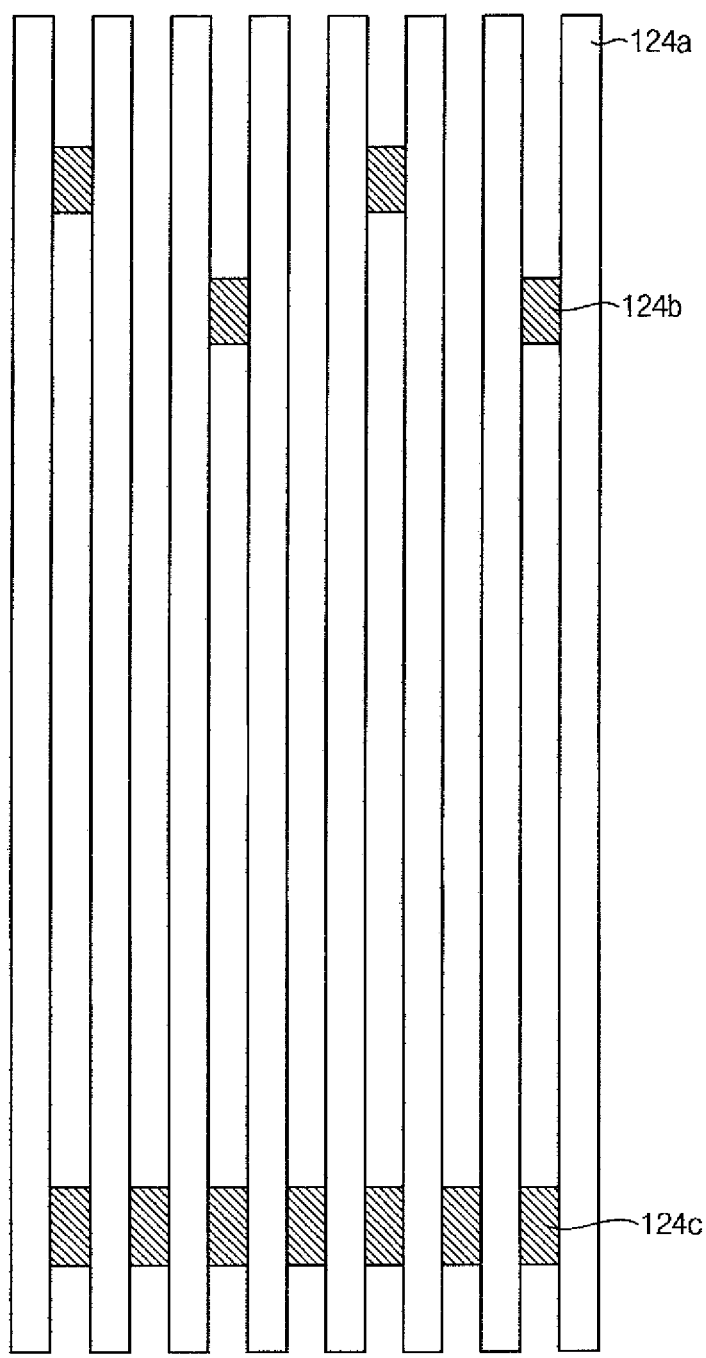

FIGS. 13A to 13C are cross-sectional views illustrating a method of manufacturing the NAND flash memory device in FIGS. 12A and 12B. FIGS. 14A to 14B are plan views illustrating a method of manufacturing the NAND flash memory device in FIGS. 12A and 12B.

First, the processes as described with reference to FIGS. 4A to 4E may be performed to form the structure in FIG. 4E.

Referring to FIG. 13A, the first hard mask pattern 104A may be removed from the substrate 100.

The process may be performed to, for example, expose the pad insulation layer 102 on the linear pattern 124a in the active region. The preliminary isolation layer pattern 122 may be formed in the isolation trench 120.

Referring to FIGS. 13B and 14A, a photoresist layer may be coated on the pad insulation layer 102 and the preliminary isolation layer pattern 122.

For example, a photolithography process may be performed to form a photoresist pattern 126a which includes a first exposing portion 128a that selectively exposes an upper surface of the preliminary isolation layer pattern 122 at positions for bridge patterns to be formed in the active region and a second exposing portion 128b at a common source region.

The preliminary isolation layer pattern 122 and the pad insulation layer 102 may, for example, be selectively etched using the photoresist pattern 126a an etching mask. The etching process may be performed to form openings 150 at positions for the bridge pattern to be formed and in the common source region.

The preliminary isolation layer pattern 122 may, for example, be etched to form a first isolation layer pattern (not illustrated) in the field region, a second isolation layer pattern (not illustrated) in the bridge pattern region in the active region, and a third isolation layer pattern 122c in the common source region. That is, the isolation layer pattern 122 may be etched to be the second isolation layer pattern and the third isolation layer pattern 122c.

The first isolation layer pattern may have, for example, a first upper surface and the second isolation layer pattern and the third isolation layer pattern 122c may have a second upper surface lower than the first upper surface.

Referring to FIGS. 13C and 14B, the photoresist pattern 126a may be removed by, for example, an ashing and strip process.

Then, for example, a selective epitaxial growth process may be performed using the exposed sidewall of the linear pattern 124a as a seed. Accordingly, single-crystalline semiconductor may, for example, be grown from the exposed sidewalls of the linear patterns 124a opposite to each other to form a bridge pattern that partially fills a lower portion of the opening and a common source pattern 124c.

The bridge pattern 124b and the common source pattern 124c may, for example, be grown from the sidewall of the linear pattern 124a. Accordingly, the bridge pattern 124b and the common source pattern 124c may have, for example, a crystal direction different from the linear pattern 124a that is formed by etching the semiconductor substrate 100. That is, the linear pattern 124a may have a first crystal direction and the bridge pattern 124b and the common source pattern 124c may have a second crystal direction different from the second crystal direction.

Then, for example, a cell transistor, string selection transistors and ground selection transistors may be formed on the substrate. Because the common source line is formed in the active region before forming the transistors, a process for forming a common source line may not be required. The processes as described with reference to FIG. 4k may be performed to form the NAND flash memory device.

Figure 15:
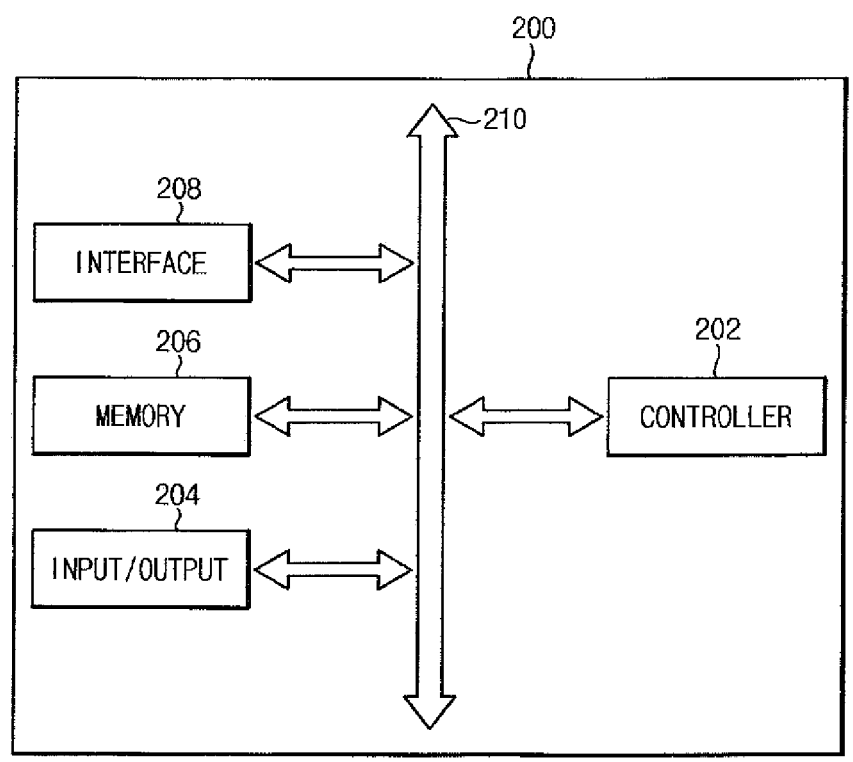

FIG. 15 is a block diagram illustrating a system in accordance with an example embodiment.

Referring to FIG. 15, a system 200 may include, for example, a controller 202, an input/output device 204, a memory 206 and an interface 208. The system 200 may be, for example, a mobile system or a system for transmitting or receiving information. The mobile system may be, for example, a PDA, a portable computer, a web tablet, a wireless phone, a mobile phone, a digital music player or a memory card. The controller 202 may execute a program and control the system. The controller 202 may be, for example, a microprocessor, a digital signal processor, a microcontroller or the like. The input/output device may be used to input or output data of the system 200. The system 200 may use the input/output device 204 to be connected to an exterior device, such as, for example, a personal computer or a network, to communicate data with the exterior device. For example, the input/output device 204 may be a keypad, a keyboard or a display. The memory 206 may store a code and/or data for operation of the controller 202, and/or store data processed in the controller 202. The memory 206 may include a nonvolatile memory in accordance with example embodiments. The interface 208 may be a path for transmitting data between the system 200 and an exterior device. The controller 202, the input/output device 204, the memory 206 and the interface 208 may be communicated by bus 210. For example, the system 200 may be applied to a mobile phone, an MP3 player, navigation, a portable multimedia player (PMP), a solid state disk (SSD) or household appliances.

As mentioned above, a highly integrated NAND flash memory device including a common bit line may be provided. The NAND flash memory may be used for various electronic control devices such as, for example, a mobile phone, an MP3 player, a navigation system, a solid state disk (SSD) or household appliances.

Having described example embodiments of the present invention, it is further noted that it is readily apparent to those of ordinary skill in the art that various modifications may be made without departing from the spirit and scope of the invention which is defined by the metes and bounds of the appended claims.

What is claimed is:

1. A semiconductor memory device, comprising:
a plurality of linear patterns disposed between a plurality of isolation trenches extending in a first direction in a semiconductor device and having a first crystal direction the same as a semiconductor substrate;
a bridge pattern connecting at least two adjacent linear patterns and including a semiconductor material having a second crystal direction different from the first crystal direction;
a first isolation layer pattern disposed in at least one of the isolation trenches in a field region of the semiconductor substrate; and
a plurality of memory cells disposed on at least one of the linear patterns, wherein the bridge pattern completely fills up the at least one of the isolation trenches in an active region of the semiconductor substrate, and wherein a bottom surface of the bridge pattern is in direct contact with the semiconductor substrate.

2. The semiconductor memory device of claim 1, further comprising
an insulation interlayer covering the semiconductor substrate; and a contact plug penetrating the insulation interlayer and making contact with the bridge pattern.

3. The semiconductor memory device of claim 2, wherein the bridge pattern and the contact plug are disposed in a zigzag pattern along a second direction perpendicular to the first direction.

4. The semiconductor memory device of claim 2, wherein the insulation interlayer is in direct physical contact with the linear patterns.

5. The semiconductor memory device of claim 1, wherein the linear patterns and the bridge pattern are positioned in the active region of the semiconductor substrate.

* * * * *